United States Patent
Miki

(10) Patent No.: US 7,034,355 B2
(45) Date of Patent: Apr. 25, 2006

(54) NONVOLATILE SEMICONDUCTOR STORAGE AND ITS MANUFACTURING METHOD

(75) Inventor: Hiroshi Miki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/496,000

(22) PCT Filed: Dec. 2, 2002

(86) PCT No.: PCT/JP02/12599

§ 371 (c)(1),
(2), (4) Date: Nov. 30, 2004

(87) PCT Pub. No.: WO03/049196

PCT Pub. Date: Jun. 12, 2003

(65) Prior Publication Data

US 2005/0079662 A1    Apr. 14, 2005

(30) Foreign Application Priority Data

Dec. 3, 2001    (JP) ............................. 2001-368081

(51) Int. Cl.
*H01L 29/76* (2006.01)
(52) U.S. Cl. ...................... 257/314; 257/315; 257/310; 257/324
(58) Field of Classification Search ................ 438/257
See application file for complete search history.

(56) References Cited

U.S. PATENT DOCUMENTS

| | | | | |
|---|---|---|---|---|
| 4,698,787 A | * | 10/1987 | Mukherjee et al. | 365/185.29 |
| 5,688,724 A | | 11/1997 | Yoon et al. | 437/235 |
| 6,008,091 A | | 12/1999 | Gregor et al. | 438/261 |
| 6,207,505 B1 | * | 3/2001 | Wu | 438/264 |
| 6,335,553 B1 | * | 1/2002 | Ra | 257/314 |
| 6,365,467 B1 | | 4/2002 | Joo | 438/287 |
| 6,509,246 B1 | | 1/2003 | Miki et al. | 438/398 |
| 6,627,494 B1 | * | 9/2003 | Joo et al. | 438/240 |
| 6,893,922 B1 | * | 5/2005 | Joo et al. | 438/261 |
| 2001/0029075 A1 | * | 10/2001 | Joo et al. | 438/257 |
| 2001/0044187 A1 | * | 11/2001 | Joo et al. | 438/264 |

(Continued)

FOREIGN PATENT DOCUMENTS

JP    4-176172    6/1992

(Continued)

OTHER PUBLICATIONS

Hiratani et al., "A heteroepitaxial MIM-$Ta_2O_5$ Capacitor with Enhanced Dielectric Constant for DRAMs of G-bit Generation and Beyond", 2001 Symposium on VLSI Technology Digest of Technical Papers, Jun. 2001, pp. 41-42.

(Continued)

*Primary Examiner*—Thao P. Le
(74) *Attorney, Agent, or Firm*—Miles & Stockbridge P.C.

(57) ABSTRACT

To achieve a higher operating speed, higher reliability, and lower power consumption by reducing the thickness of an inter-poly silicon insulator film between a floating gate and a control gate of a flash memory, a silicon dioxide film, a silicon nitride film, tantalum pentoxide, and a silicon dioxide film are formed in a multilayer structure to serve as the inter-poly insulator film between a floating gate and a control gate. With this configuration, tantalum pentoxide formed on the silicon nitride film has a dielectric constant of 50 or more, which is higher than that of the silicon dioxide film, and the thickness of the inter-poly silicon insulator film can be reduced.

43 Claims, 21 Drawing Sheets

U.S. PATENT DOCUMENTS

2001/0045590 A1 11/2001 Kobayashi .................. 257/298
2001/0046738 A1* 11/2001 Au et al. .................... 438/261

FOREIGN PATENT DOCUMENTS

| JP | 4-334067 | 11/1992 |
| --- | --- | --- |
| JP | 7-183409 | 7/1995 |
| JP | 11-260938 | 9/1999 |
| JP | 2000-22139 | 1/2000 |
| JP | 2000-049241 | 2/2000 |
| JP | 2000-195856 | 7/2000 |
| JP | 2000-216360 | 8/2000 |
| JP | 2001-15714 | 1/2001 |

OTHER PUBLICATIONS

Manchanda et al., "Gate Quality Doped High K Films for CMOS Beyond 100 nm: 3-10nm $Al_2O_3$ with Low Leakage and Low Interface States", *IEDM 98-605*, 1998, pp. 21.6.1-21.6.4.

Lee et al., "A Novel High K Inter-Poly Dielectric (IPD), $Al_2O_3$ for Low Voltage/High Speed Flash Memories: Erasing in msecs at 3.3V", 1997 Symposium on VLSI Technology Digest of Technical Papers, pp. 117-118.

* cited by examiner

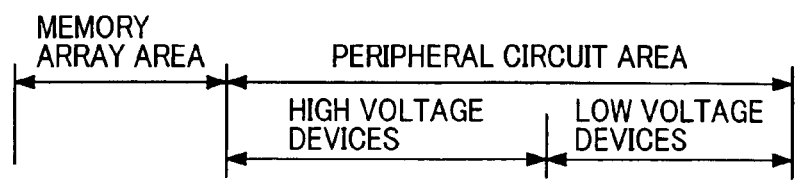
FIG.11A
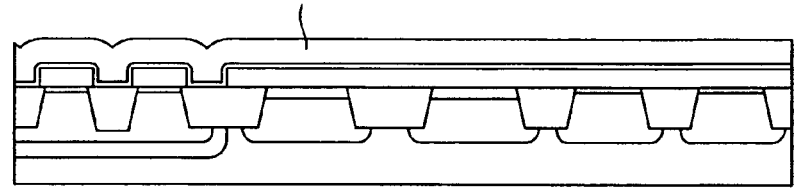
FIG.11B
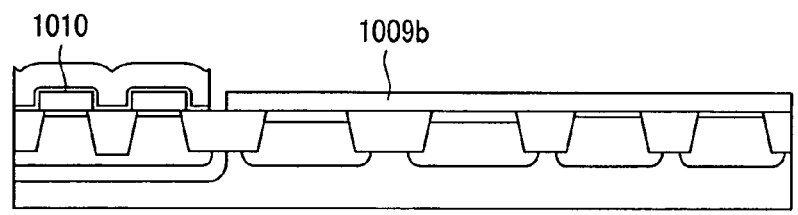
FIG.11C
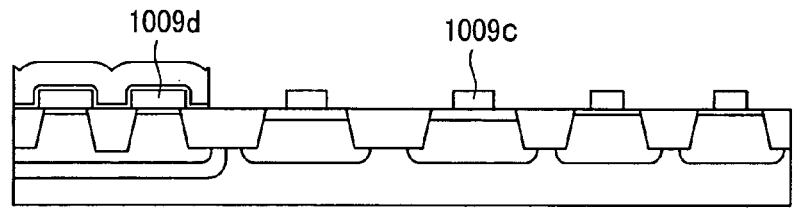
FIG.11D
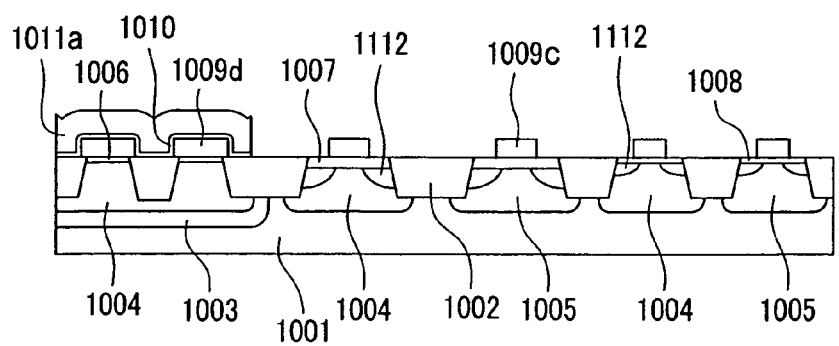

NONVOLATILE SEMICONDUCTOR STORAGE AND ITS MANUFACTURING METHOD

TECHNICAL FIELD

The present invention relates to a nonvolatile semiconductor memory device and its manufacturing method. More specifically, the invention relates to a technique that can achieve miniatuarization, higher integration, a higher operating speed, and high reliability.

BACKGROUND ART

Miniatuarization and high integration of nonvolatile memories with their floating gates introduced into gate insulator film multilayer structures of MOS transistors are easy, because of their simple structure. Thus, the nonvolatile memory becomes a standard nonvolatile memory cell structure in a silicon integrated circuit. Flash memories, in particular, which have enabled electrical bulk erasing, are suitable for implementation of small-sized, large-capacity nonvolatile semiconductor memory devices. Thus, taking the flash memory as the memory that is essential for portable information devices, development efforts toward a larger capacity, a higher operating speed, lower power consumption, and higher reliability of the flash memory are continued.

Generally, the MOS transistor gate multilayer structure of a flash memory cell includes two types of conductive layers: a floating gate and a control gate, formed of a poly silicon film. Further, an inter-poly insulator film that separates these two types of conductive layers and a tunnel dielectric are disposed. The tunnel dielectric separates the floating gate from the surface of a silicon substrate below which an MOS transistor channel is formed. Thus, functionally, the multilayer structure is of the four-layer structure in which two types of insulator layers and two types of conductive layers are laminated. In terms of an equivalent circuit, the multilayer structure is of the structure in which a capacitor C1 formed of the control gate, inter-poly insulator film, and floating gate is connected in series with a capacitor C2 formed of the floating gate, tunnel dielectric, and channel.

A control gate voltage necessary for forming the channel of the MOS transistor differs according to the presence or absence of electrical charge stored in the floating gate, which is used for information memory device in this memory cell. Electrical charge injection into the floating gate is implemented by applying a comparatively high voltage to the control gate, thereby causing the electrical charge to flow into the floating gate through the tunnel dielectric capacitor C2 from the surface of the silicon substrate. The tunnel dielectric capacitor C2 needs to meet a requirement that the electrical charge be passed through, which is extremely severe in view of reliability of the insulator film, and because of the need for having the property of not letting the electrical charge stored in the floating gate escape during an information holding operation, a silicon dioxide film is generally employed. If injected electrical charge leaks out to the control gate through the inter-poly insulator capacitor C1 during an operation of electrical charge injection into the floating gate, the injection cannot be efficiently performed. For this reason, a capacitor structure in which leakage current is small even if a high electrical field is applied is generally adopted for the inter-poly insulator capacitor C1. Generally, a so-called ONO structure in which a silicon nitride film is sandwiched between silicon dioxide films is employed for the inter-poly insulator film.

On the other hand, in order to efficiently perform electrical charge injection into the floating gate, it is important to apply the control gate voltage on the serious structure of C1 and C2 to the tunnel dielectric capacitor C2 as much as possible. By enhancing this efficiency, high-speed information memory device becomes possible. In order to achieve this, it is desirable that the capacity of C1 should be larger than the capacity of C2 as much as possible. This corresponds to reduction in the thickness of the inter-poly insulator film constituting C1 as much as possible. However, for the reason described before, C1 must have small leakage current even if a high electrical field is applied thereto. How to solve these two contradictory technical problems is the most important challenge for the inter-poly insulator film of the flash memory.

The ONO structure that is in most wide use, for example, is a technique most widely used for this challenge. The silicon nitride film has a dielectric constant twice as large as the silicon dioxide film, and can reduce the leakage current. A technique for employing alumina or tantalum pentoxide is likewise proposed as the technique that uses the insulator film having a high dielectric constant. This is discussed on pp. 117–118 of 1997 Symposium on VLSI Technology Digest of Technical Papers (1997). On the other hand, a technique for adding zirconium or silicon to alumina, thereby obtaining the same effect is discussed on pp. 605–608 of 1998 International Electron Device Meeting (IEDM) Technical Digest (1998).

If a tantalum pentoxide film, in particular, is employed, its dielectric constant, which is about seven times that of the silicon dioxide film can be used. Thus, the effect becomes large. A structure in which the tantalum pentoxide film is laminated onto the silicon dioxide film or the silicon oxynitride film or a structure in which the tantalum pentoxide film is sandwiched by the silicon dioxide films is known. JP-A-2000-195856, JP-A-2000-49241, JP-A-11-260938, and JP-A-2001-15714, for example, can be pointed out as describing the structure of this type.

DISCLOSURE OF THE INVENTION

However, among two crystalline phases of tantalum pentoxide that can be implemented in a usual silicon integrated circuit process, the prior arts described above might use only tantalum pentoxide in a crystalline phase having a smaller dielectric constant or amorphous tantalum pentoxide.

Further, the prior arts make no mention of a method of fabricating a peripheral circuit area that is essential for a nonvoltile semiconductor memory device. Study of inventors revealed that tantalum, which is a constituent element of tantalum pentaoxide, is notably diffused into transistors in the peripheral circuit area during annealing after its deposition, thereby causing performance deterioration.

Still further, in the nonvolatile semiconductor memory device in which the performance deterioration of the transistors in the peripheral circuit area due to tantalum does not become a problem, it became clear that no use of tantalum pentoxidxe in the peripheral circuit area made the process more complicated.

One object of the present invention is to implement a flash memory with higher integration, a higher operating speed, lower power consumption, and higher reliability, by applying tantalum pentoxide, which has a dielectric constant several times as large as that in its amorphous phase or its lower dielectric constant phase, to an inter-poly silicon insulator film of a flash memory cell.

Other object of the present invention is to implement a low cost flash memory by applying the inter-poly silicon insulator film to a peripheral circuit area as well, thereby simplifying the process.

According to one aspect of the present invention, the inter-poly silicon insulator film formed between the floating gate and the control gate was constituted from a multilayer film including at least three layers comprising a first silicon dioxide layer, a layer having nitrogen and silicon employed as main constituent elements, and a tantalum pentoxide layer. With this configuration, tantalum pentoxide can be crystallized to a high dielectric constant phase, and leakage current can also be reduced.

This configuration can also be applied to a structure having a first floating gate and a second floating gate electrically connected to the floating gate.

This configuration can also be applied to a structure having a third assist gate between floating gates.

This configuration can also be applied to a nonvolatile semiconductor device collectively referred to as a split gate type, in which the control gate is also present in the same plane as the floating gate.

Further, according to other aspect of the present invention, when the inter-poly silicon insulator film including tantalum pentoxide was formed over the floating gate, a poly silicon layer formed simultaneously with the floating gate was disposed over the gate insulator films of peripheral circuit transistors to serve as a diffusion barrier. After completion of crystallization, the diffusion barrier was removed.

Further, according to other aspect of the present invention, an insulator film including tantalum pentoxide is employed as the gate insulator films and capacitor insulator films of the peripheral circuit area transistors.

Other objects, characteristics, and advantages of the present invention will become apparent from description of following embodiment of the present invention in conjunction with appended drawings.

BRIEF DESCRIPTION OF THE DRAWINGS

FIGS. 11A to 11D are diagrams showing manufacturing steps according to a preferred embodiment of the present invention;

BEST MODE FOR CARRYING OUT THE INVENTION

Figure 1:
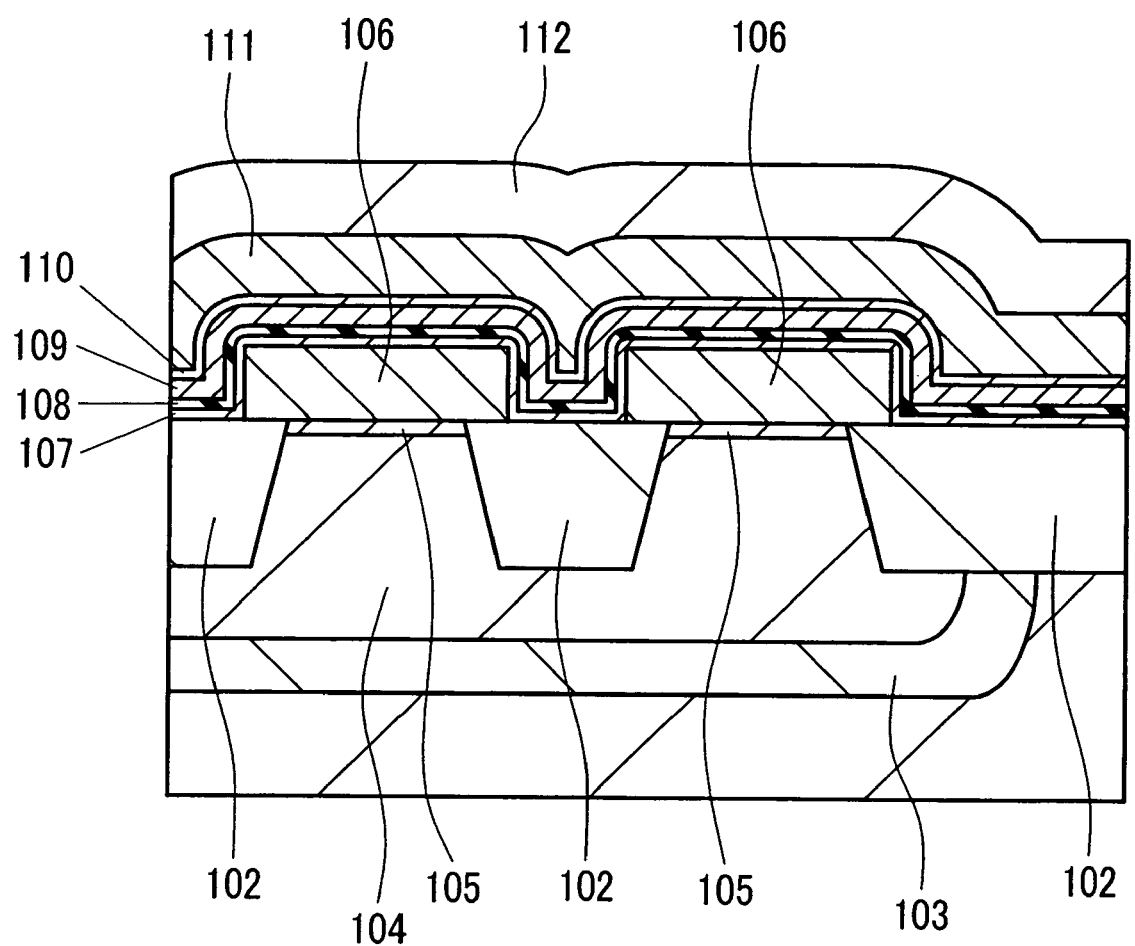
FIG. 1 is a sectional view in a direction parallel to a word line in a memory array area of a nonvolatile semiconductor memory device according to an embodiment of the present invention.

First, preferred embodiment modes of the present invention will be outlined, based on FIGS. 1 to 4. These figures are sectional views of a memory cell portion of an NOR-type flash memory. The section in FIG. 1 was illustrated in a direction parallel to a word line (control gate line), and the section in FIG. 3 was illustrated in a direction perpendicular to the word line. In these figures, a multilayer insulator film constituted from four layers is formed between a floating gate (106) and a control gate (111). The layers are a silicon dioxide film (107), a silicon nitride film (108), a tantalum pentoxide film (109), and a silicon dioxide film (110), respectively, seen from a side in contact with the floating gate. This structure will be hereinafter referred to as an ONTO structure.

Configuration examples of the ONTO structure that achieves a preferred thickness will be described according to the sequence of manufacture. Incidentally, specific methods of manufacturing the ONTO structure including a peripheral circuit will be disclosed later in the form of first to fourth embodiments.

Wells (103, 104), isolations (102), a tunnel oxide film (105), and the floating gate (106) are formed on the main surface of a P-type silicon substrate, using a known technique. The floating gate (106) is formed of poly silicon. On this floating gate, the silicon dioxide film (107) with a thickness of 2 nm was first formed by a CVD method. Then, the silicon nitride film (108) with a thickness of 4 nm was formed by the CVD method. The tantalum pentoxide film (109) was formed by the CVD method that uses tantalum pentaethoxide and oxygen at a substrate temperature of 450° C. Its thickness is 10 nm. This tantalum pentoxide was annealed in oxygen at atmospheric pressure for 30 minutes at 800° C., for crystallization. Next, using the CVD method again, the silicon dioxide film (110) was formed to a thickness of 3 nm. Further, the control gate (111) formed of poly silicon is laminated thereon and processed. An unwanted portion of the floating gate is removed as necessary, thereby forming an inter-poly silicon capacitor. Thereafter, using a known technique, a punch through stopper (301), source and drain diffusion layers (302), an intermetal dielectric (112), contact holes and wiring (303) were formed, thereby obtaining the structure of a memory cell in FIGS. 1 and 3.

Figure 2:
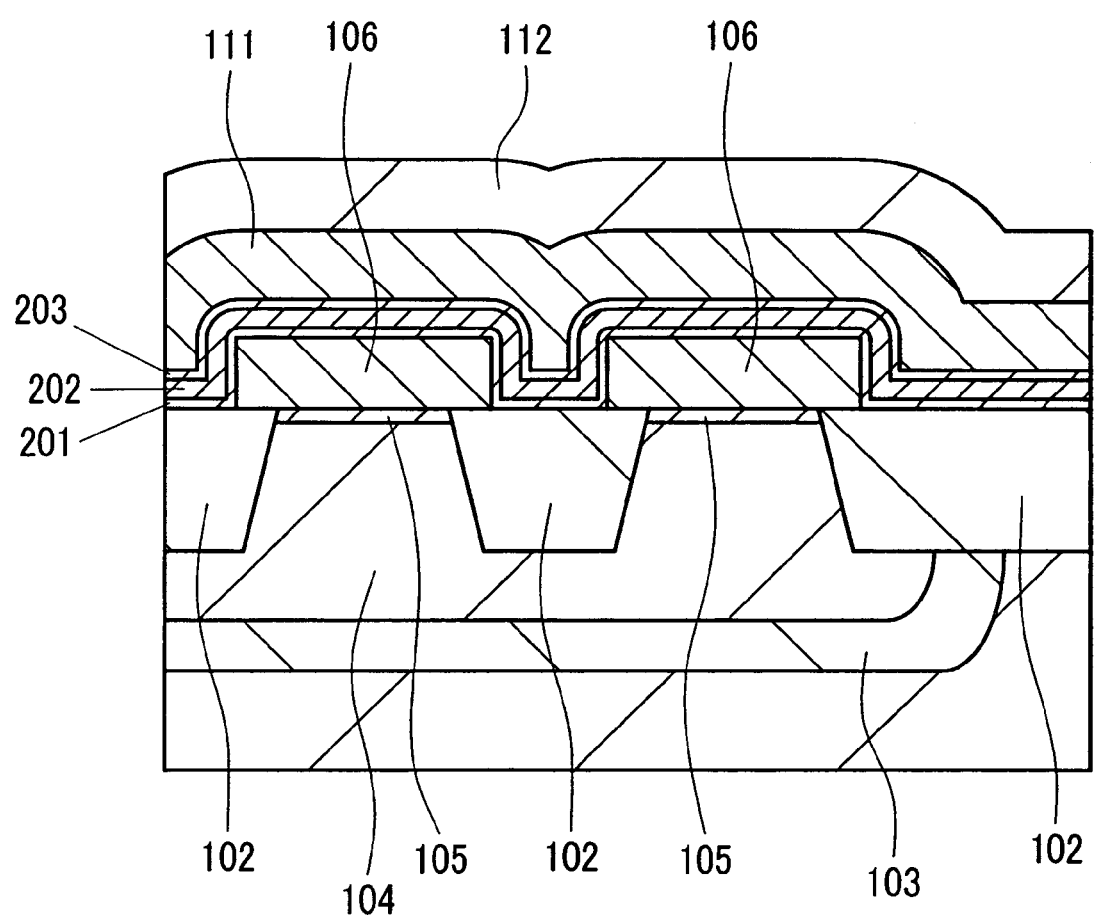
FIG. 2 is a sectional view in a direction parallel to a word line of a memory array area of a nonvolatile semiconductor memory device according to a prior art.
Figure 3:
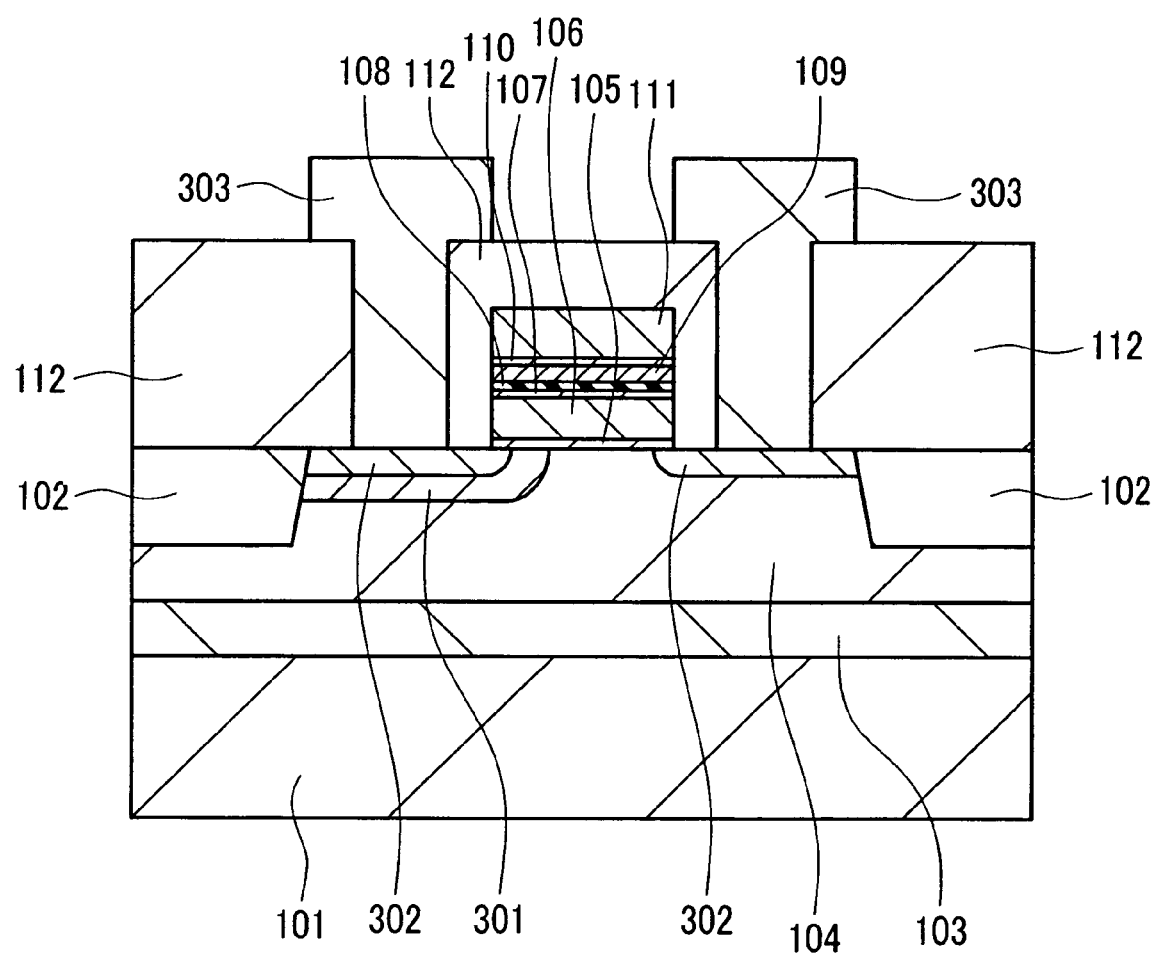
FIG. 3 is a sectional view in a direction perpendicular to the word line of the memory array area of the nonvolatile semiconductor memory device according to the embodiment of the present invention.
Figure 4:
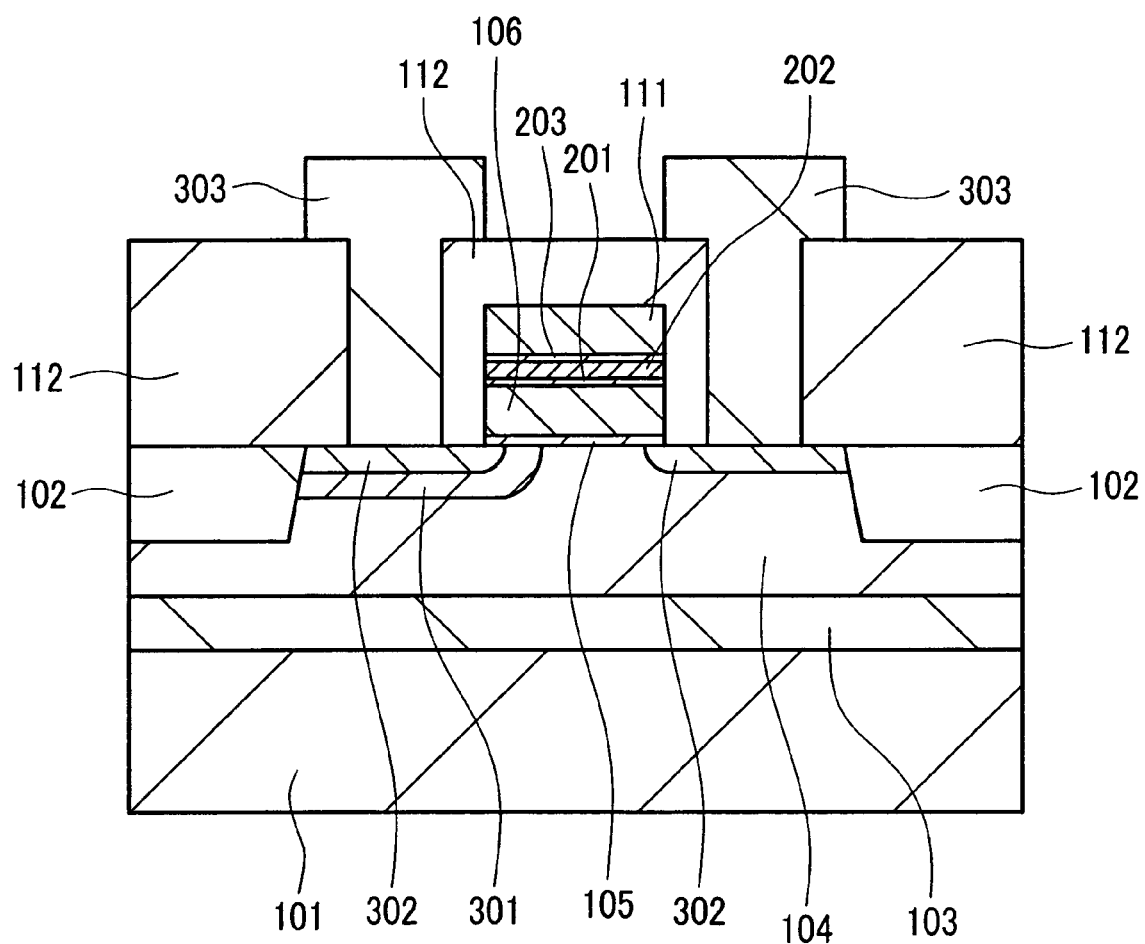
FIG. 4 is a sectional view perpendicular to the word line of the memory array area of the nonvolatile semiconductor memory device according to the prior art.

On the other hand, an example that used a three-layer structure constituted from the silicon dioxide film, tantalum pentoxide film, and silicon dioxide film, which is a known inter-poly silicon insulator film structure is shown in FIG. 2 (illustrating a section in a direction parallel to the word line) and FIG. 4 (illustrating a section in a direction perpendicular to the word line). This multilayer structure constituted from three layers will be hereinafter referred to as an OTO structure. Since the steps before formation of the floating gate (106) and the steps after formation of the control gate (111) were all set to be the same as in the present invention shown in FIGS. 1 and 3. Thus, only the inter-poly silicon insulator film structure will be described herein.

After a silicon dioxide film (201) with a thickness of 4 nm was formed over the poly silicon floating gate using the CVD method, a tantalum pentoxide film (202) was formed at a substrate temperature of 450° C. using the CVD method that used tantalum pentaethoxide and oxygen. Its thickness is 10 nm. This tantalum pentoxide was annealed in oxygen at atmospheric pressure for 30 minutes at 800° C., for crystallization. Next, using the CVD method again, the silicon dioxide film (110) was formed to a thickness of 3 nm. Thereafter, with the steps after formation of the control gate (111) passed through, the structure in FIGS. 2 and 4 was obtained. It means that a difference of the memory cell that used the ONTO structure according to the present invention from a memory cell that used the known OTO structure is the presence of the formation step of the silicon nitride film (108).

Figure 5:
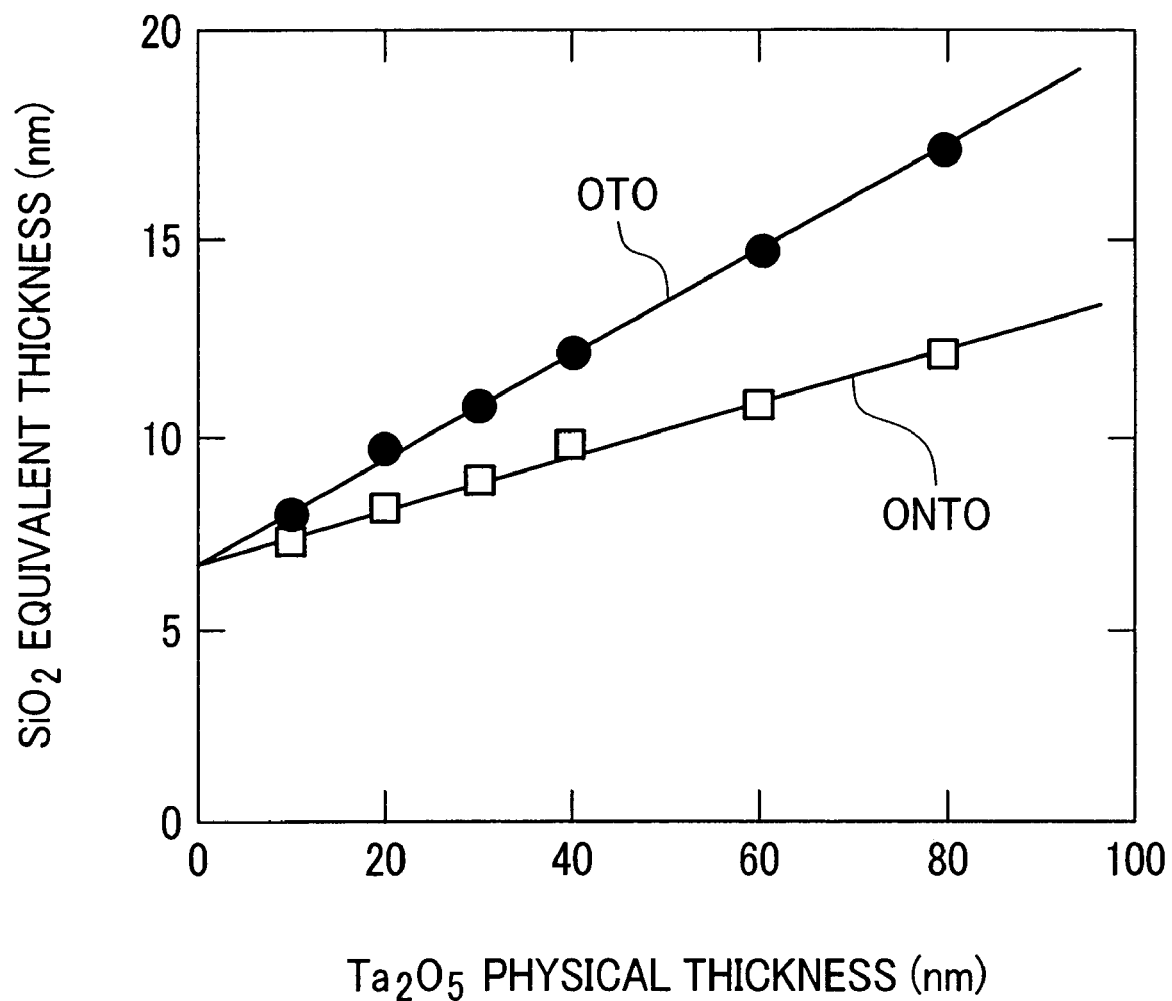
FIG. 5 is a graph comparing the dielectric constant of tantalum pentoxide constituting an inter-poly silicon insulator film between the prior art and the present invention.

Using the memory cells having these two structures, electrical characteristics of the inter-poly insulator films were compared. Though FIGS. 1 to 4 showed the case where the thickness of the tantalum pentoxide film was 10 nm, FIG. 5 shows an equivalent thickness of the silicon dioxide film when the physical thickness of the tantalum pentoxide film was varied from 10 nm to 80 nm. The thicknesses of the silicon dioxide films and the silicon nitride film are fixed. In the OTO structure, the value obtained by extrapolation of a direct line through respective points to the physical thickness of 0 nm is equivalent to the sum of the thickness of the silicon dioxide film at the interface with the floating gate and the silicon dioxide film at the interface with the control gate. In the ONTO structure, the value is equivalent to the sum of the thicknesses of three layers of the silicon dioxide film at the interface with the floating gate and the silicon dioxide film at the interface with the control gate, and the equivalent thickness of the silicon dioxide film to the silicon nitride film. The values are approximately 7 nm both in the ONTO structure and the OTO structure. Next, the slope of the direct line through the respective points gives the ratio of the dielectric constant of the silicon dioxide film to the dielectric constant of tantalum pentoxide. The dielectric constant thus obtained was approximately 30 for the OTO structure and approximately 60 for the ONTO structure. X-ray diffraction confirmed that the tantalum pentoxide films in both structures were crystallized.

The value of 25 for the dielectric constant of tantalum pentoxide when the tantalum pentoxide has become amorphous or a crystalline phase of a long range order called a β phase is known. Thus, it can be considered that crystallization to the β phase has taken place in the OTO structure. On the other hand, it is inferred that when the ONTO structure is used according to the present invention, by the effect of the silicon nitride film, which is the base when crystallization of tantalum pentoxide takes place, crystallization to a high dielectric constant phase known as the δ phase occurs.

As seen from FIG. 5, when the equivalent thickness of the silicon dioxide film of approximately 8 nm is achieved, it is necessary to reduce the thickness of the tantalum pentoxide film to 10 nm in the OTO structure. However, in the ONTO structure, thickness reduction to 20 nm suffices. As is widely known, when the thickness of the insulator film is reduced, the probability of causing defects such as a pinhole increases, thereby reducing manufacturing yields. According to the present invention, a thicker tantalum pentoxide film could be employed, so that the yield of the flash memory could be improved.

Figure 6:
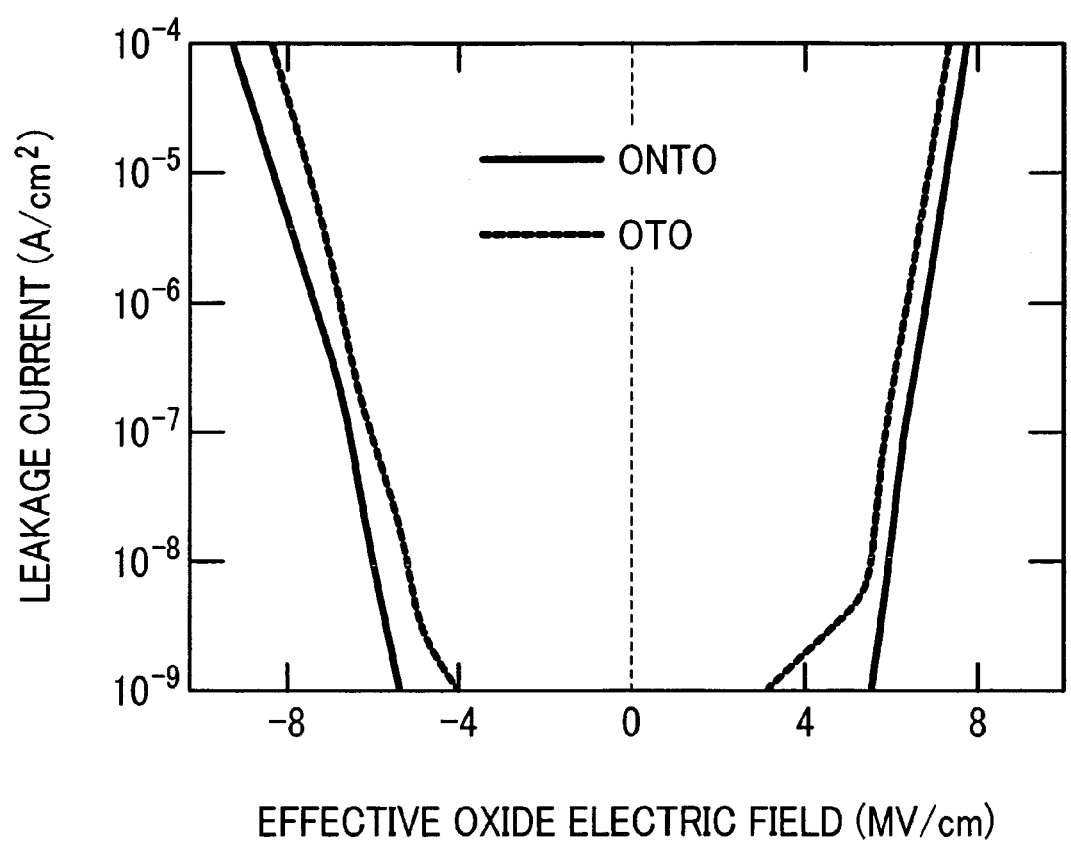
FIG. 6 is a graph comparing the leakage current of the inter-poly silicon insulator film between the prior art and the present invention.

In the flash memory, an extremely minute leakage current in a low electric field brings about loss of electrical charge stored in the floating gate, thereby deteriorating its information holding characteristic. When the thickness of the insulator film is reduced to approximately 5 nm or less, the leakage current in the low electric field due to a tunneling effect becomes manifest. FIG. 6 shows a comparison between the leakage current in the OTO structure and the leakage current in the ONTO structure. It can be seen that by employing the ONTO structure, the leakage current in the low electric field is also reduced, in addition to reduction of leakage current in a high electric field.

According to the technical literature, a difference between the electron affinity of tantalum pentoxide in the β phase, which is a low dielectric constant phase and the electron affinity of silicon as a metal is approximately 0.3 eV, which is a small value. Electrons are thus readily injected from silicon. Accordingly, tantalum pentoxide cannot be directly brought into contact with silicon, so that the leakage current cannot be reduced until the silicon dioxide film is formed at the interface. However, in order to achieve a small thickness necessary for a minute flash memory, the thickness of the silicon dioxide film at the interface must be thin such as 4 nm. Electrons that have tunneled through the silicon dioxide film at the interface are apt to enter the conduction band of tantalum pentoxide due to its small electron affinity difference, thereby causing the leakage current. In the OTO structure, the leakage current in the low electric field could not be reduced to a practicable level. This is considered to be caused by the fact that tantalum pentoxide directly formed over the silicon dioxide film is in the β phase.

On the other hand, in the ONTO structure, due to crystallization of tantalum pentoxide into the δ phase, a difference between the electron affinity of tantalum pentoxide and that of silicon becomes larger. Tantalum pentoxide itself thereby also acts as part of a tunnel barrier. Thus, it can be interpreted to have led to reduction in the leakage current in the low electric field as shown in FIG. 6. Accordingly, in the ONTO structure of the present invention, the thicknesses of the silicon dioxide film that is present at the interface between the silicon for the electrode and tantalum pentoxide and the silicon nitride film could be reduced to 5 nm or less where tunneling current becomes pronounced. As a result, the thickness of the equivalent thickness of the silicon dioxide film could be reduced more than in the conventional OTO structure.

Incidentally, a structure in which the silicon nitride film is employed for the interface between the control gate and the tantalum pentoxide was also studied. As a consequence, it was found that using the thermal CVD method that uses at least widely-used ammonia and silane, the leakage current increased suddenly due to reduction of the tantalum pentoxide. As in the leakage current in an OTN structure (a structure having the silicon dioxide film, tantalum pentoxide film, and silicon nitride film, seen from the side of the floating gate), insulation is completely lost. This phenomenon also held true of the tantalum pentoxide film in the δ phase. For this reason, deposition of the silicon nitride film using a lower-temperature and less reductive formation method such as a plasma CVD method was required for prevention of degradation due to the leakage current. The dielectric constant of tantalum pentoxide was not affected by formation of the silicon nitride film over tantalum pentoxide. That is, in the OTN structure, it remained to be approximately 30. On the other hand, in a structure constituted from the silicon nitride film, tantalum pentoxide film, and silicon nitride film (hereinafter an NTN structure), it was approximately 60. More specifically, it is clear that the dielectric constant is determined by a base material for formation of the tantalum pentoxide film. In other words, the effect of the present invention results from use of the silicon nitride film as a base for formation of the tantalum pentoxide film, and crystallization of tantalum pentoxide into a high dielectric constant phase, and does not result from a contact between tantalum pentoxide and the silicon nitride film. The NTN structure in which a low-damaged silicon nitride film that does not cause an increase in leakage current was formed over tantalum pentoxide is one of preferred embodiments of the present invention. However, the most preferred embodiment is the ONTO structure in which the silicon nitride film is present at the interface with the floating gate and is not present at the interface with the control gate.

Figure 7:
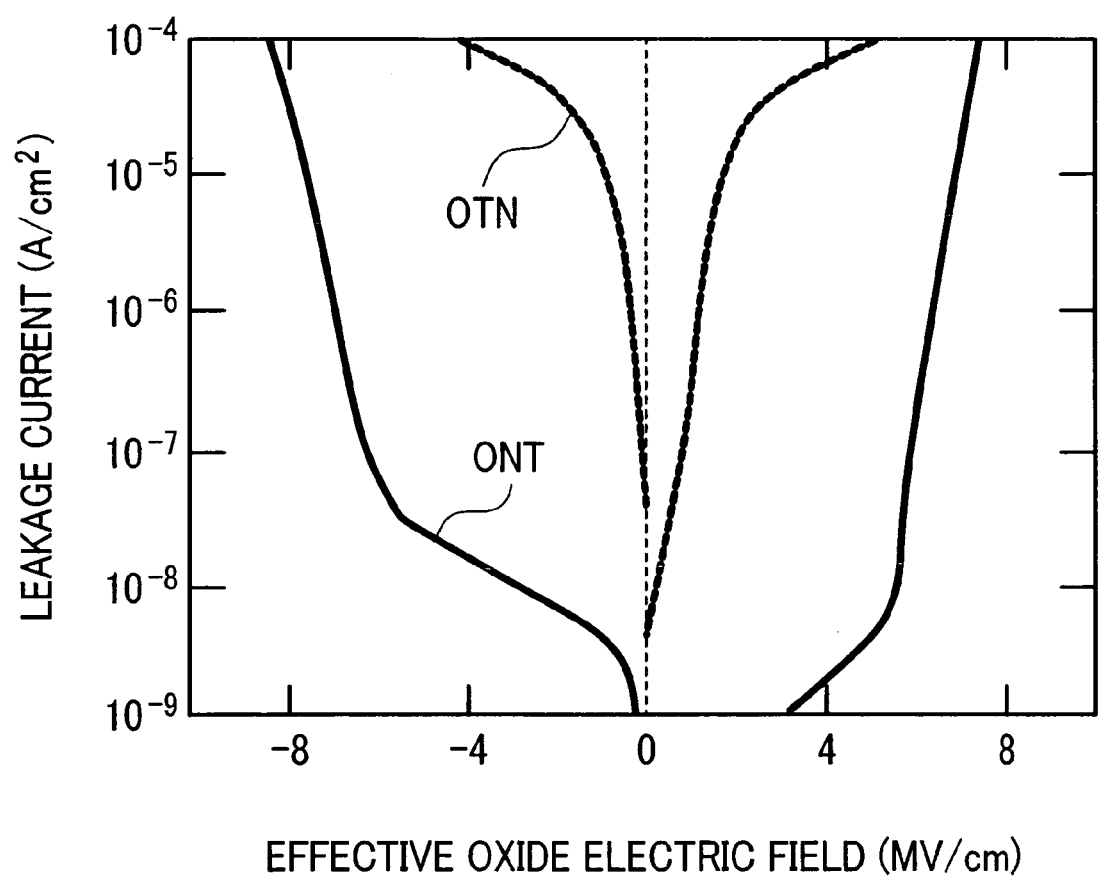
FIG. 7 is a graph showing leakage currents when other configuration was employed for the inter-poly silicon insulator film.

A method in which the control gate is directly formed on the tantalum pentoxide film without using the silicon dioxide film as a medium can also be conceived. In this case, it was found that poly silicon of the control gate was oxidized during film formation of the poly silicon or annealing in a subsequent step, thereby substantially forming the ONTO structure of the present invention. In an example of the ONTO structure in FIG. 7 (a three-layer structure constituted from the silicon dioxide film, the silicon nitride film, and the tantalum pentoxide film, as seen from the side of the floating gate), there is no step of deposition of the silicon dioxide film at the interface with the control gate. However, it was found that the structure is in the state where poly silicon of the control gate was oxidized to a thickness of approximately 1 nm from the interface with tantalum pentoxide to become the silicon dioxide film. Thus, substantially the ONTO structure was formed. The leakage current in the low electrical field at a low voltage is high, which is caused by the fact that the thickness of the silicon dioxide film is far thinner than those in FIGS. 1 and 3. By using a higher temperature as a requirement for deposition of the poly silicon film, and making annealing in a subsequent step longer at a higher temperature, a thicker silicon dioxide film was formed. The leakage current characteristic comparable to that in the ONTO structure in FIG. 6 was obtained.

Next, an influence of oxygen in an N layer (silicon nitride film) in the ONTO structure was investigated. More specifically, a comparison with a memory cell in which the silicon nitride (108) in FIGS. 1 and 3 was replaced by a silicon oxynitride film was made. As the silicon oxynitride film, the silicon nitride film with a thickness of approximately 2 nm, formed by thermal CVD and annealed in dry oxygen for 15 minutes at 850° C. for oxidation was used. By a composition analysis using an x-ray photoelectron spectroscopy, the ratio of the number of oxygen atoms to nitrogen atoms in this silicon oxynitride film was estimated to be approximately two to one.

Figure 8:
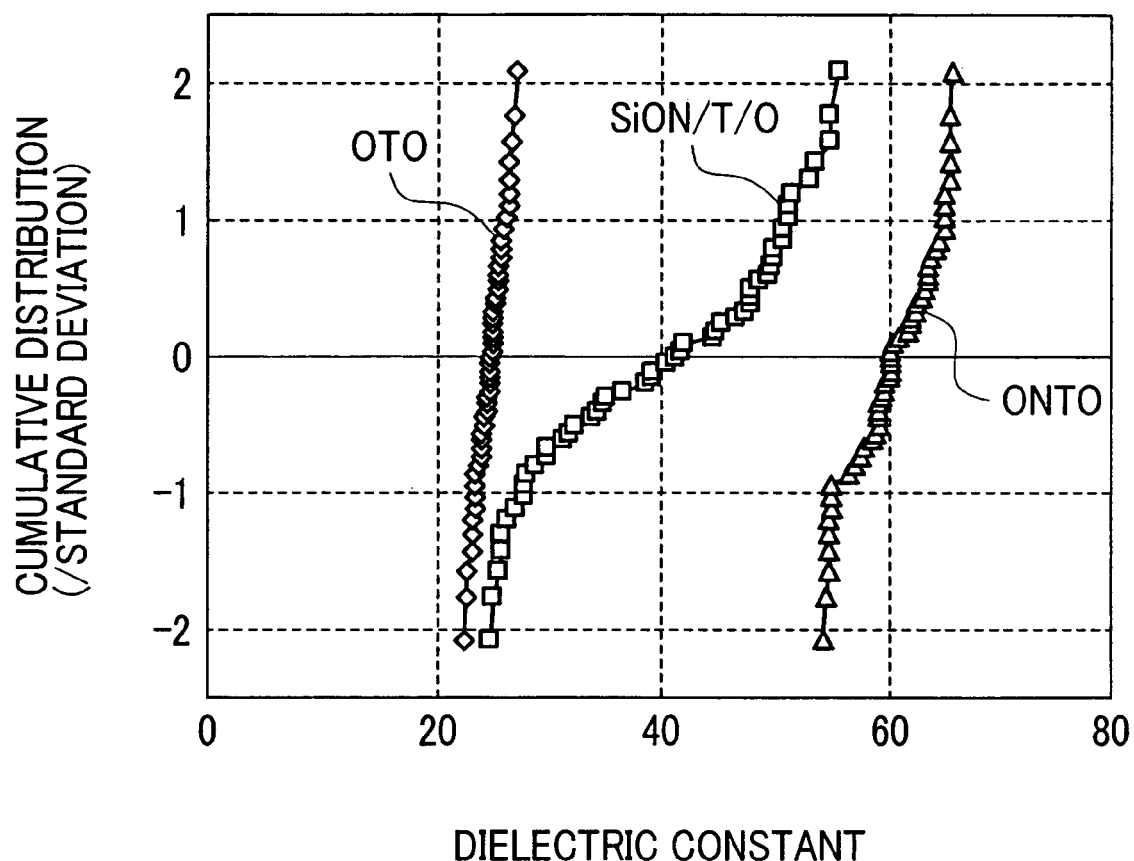
FIG. 8 is a diagram comparing cumulative distributions of the dielectric constants of tantalum pentoxide constituting inter-poly silicon insulator films.

FIG. 8 shows the in-wafer-surface cumulative distributions of the dielectric constants of tantalum pentoxide determined from a capacitance between the floating gate and the control gate. The dielectric constant of the silicon oxynitride film becomes an intermediate value between that of the silicon nitride film in FIGS. 1 and 3 and the silicon dioxide film in FIGS. 2 and 4; and the effect of increasing the dielectric constant was seen, but to far lesser extent than with the silicon nitride film. However, the in-surface distribution of the dielectric constant has become very large. Crystallization on the silicon nitride film can ensure the dielectric constant of approximately 50 or higher. However, on the silicon oxynitride, a great variation such as seen from a chip showing the dielectric constant of approximately 30, which is almost unchanged from the dielectric contact with the silicon dioxide film, to a chip showing the dielectric constant that exceeds 50, was found. For this reason, a variation of the write/erasing characteristic of a memory cell has become large, so that it was found not to be suitable for the manufacture of a memory. Accordingly, it is essential that the silicon nitride film rather than the silicon oxynitride film should be employed when tantalum pentoxide with a high dielectric constant is used. Incidentally, there is no need to say that even if the silicon nitride film is employed, oxygen diffusion into the silicon nitride film takes place due to annealing for crystallization of tantalum pentoxide or thermal history in a subsequent step. When this influence was studied using an oxidization process in oxygen at 950° C., diffusion of oxygen atoms almost equal in number to nitrogen was confirmed in the silicon nitride film (108). Reduction in the dielectric constant of the tantalum pentoxide film, however, was not seen. It means that oxygen, which has diffused into the nitride film after crystallization of tantalum pentoxide has been completed will not reduce the dielectric constant of tantalum pentoxide. Further, in this case, an in-surface variation of the dielectric constant seen after deposition of tantalum pentoxide on the silicon oxynitride film for crystallization did not occur. Accordingly, techniques for forming tantalum pentoxide on the silicon nitride film, as disclosed in JP-A-2000-195856, JP-A-2001-15714, for example, and the present invention bring about exactly different effects.

Figure 9:
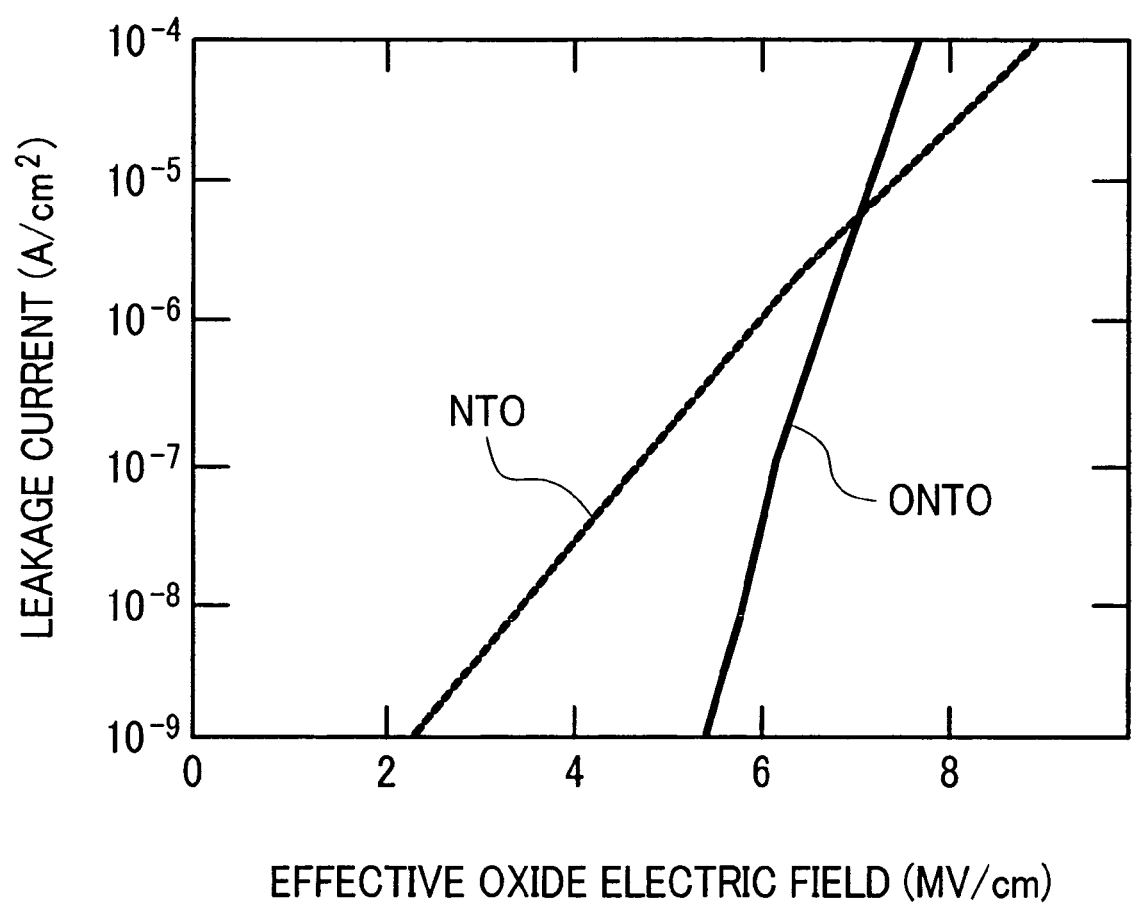
FIG. 9 is a graph showing leakage currents when other configuration was employed for the inter-poly silicon insulator film.

Next, the effect of an O layer (silicon dioxide film) at the interface with the floating gate in the ONTO structure was investigated. FIG. 9 compares voltage dependency of the leakage currents between the floating gate (106) and the control gate (111) according to the presence of the silicon dioxide film (107) disposed between the floating gate (106) and the silicon nitride (108) in FIG. 1 or 3. As is clear, when the silicon dioxide film is not present, the leakage current at a low voltage has increased. It is considered that, due to a low barrier to electrons between the silicon nitride film and the metal silicon and presence of a large number of electron traps in the silicon nitride, electrons leak from the floating gate. For this reason, if the silicon dioxide film (107) is removed, the retention characteristic of a memory cell deteriorated, so that application has become impossible.

As clear from a foregoing description, by using the ONTO structure of the present invention, an inter-poly silicon insulator film with a sufficiently small leakage current and a small variation can be achieved through the use of the highly dielectric constant phase of tantalum pentoxide. Manufacturing steps of a flash memory that applies this ONTO structure will be disclosed more specifically, including the relationship between a peripheral circuit.

First Embodiment

In this embodiment, an example is disclosed in which, by avoiding exposure of gate insulator films of transistors in a peripheral circuit and interfaces with silicon at the time of deposition of tantalum pentoxide of an ONTO structure and performing crystallization in a state where they were covered with poly silicon, a characteristic such as leakage current was improved at the standby time of the transistors in the peripheral circuit. This embodiment is the example where a memory cell configuration popularly called as an NOR type was adopted.

Main portions of manufacturing steps of a nonvolatile semiconductor memory device in this embodiment are shown in FIGS. 10A to 10F and FIGS. 11A to 11D. The nonvolatile semiconductor memory device is broadly classified into:

(1) a memory array area in which memory cells are disposed in an array; and (2) a peripheral circuit area that functions to make memory cell selection and information reading and writing. The peripheral circuit area can be further classified into two types constituted from:

(2-1) high voltage devices to which a voltage such as 10V or higher, necessary for information rewriting is applied; and (2-2) low voltage devices that operate a comparatively low voltage such as 3.3V. In the drawings, the respective regions were displayed using arrows on top. FIGS. 10A to 10F and FIGS. 11A to 11D show sections of the memory array area parallel to a word line (a control gate line) and sections of the peripheral circuit area vertical to the gates of the transistors in the peripheral circuit area.

Figure 10A:
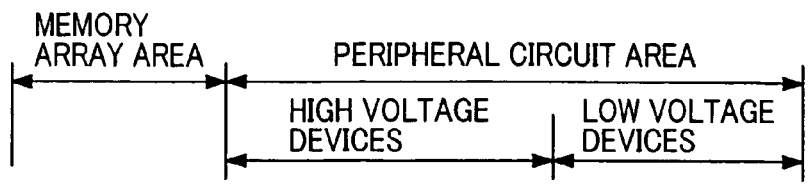
FIGS. 10A to 10F are diagrams showing manufacturing steps according to a preferred embodiment of the present invention.

The manufacturing method is as follows:

First, isolation regions (1002) for isolating memory cells and the transistors in the peripheral circuit area are formed in a p-type silicon substrate (1001) with a (100) surface orientation (FIG. 10A).

Figure 10B:
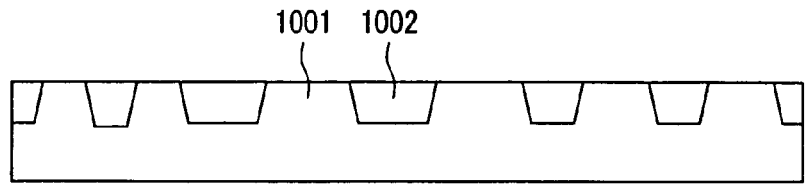

Next, by ion implantation, memory cell isolation regions (1003), P-well regions (1004), and N-well regions (1005) were formed (FIG. 10B).

Figure 10C:
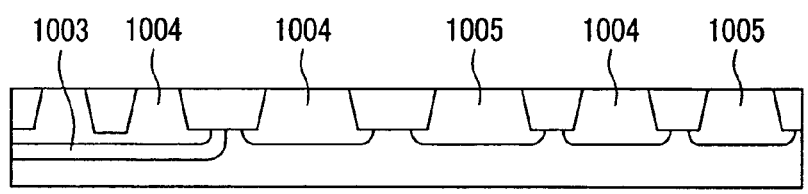

Then, tunnel dielectrics (1006) for the memory cells, gate insulator films (1007) for the peripheral circuit high voltage devices, and gate insulator films (1008) for the peripheral circuit low voltage devices were formed by thermal oxidation. First, a 30-nm silicon dioxide film was formed over an entire surface by the thermal oxidation method. Next, after the high voltage devices were covered with a photo resist (not shown) using a known lithography technique, the film thickness of the memory array area and the low voltage devices were reduced with buffered HF to a thickness of 9 nm (FIG. 10C).

Figure 10D:
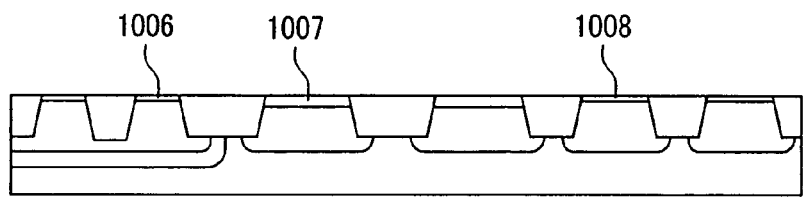

Next, a phosphorous-doped poly silicon film (1009), which will become floating gates and gate electrodes for the peripheral circuit was deposited to a thickness of 150 nm (FIG. 10D).

Figure 10E:
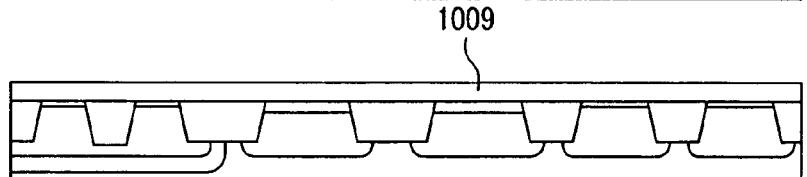

This poly silicon film was patterned using the known lithography and dry etching technique. At this step, only the poly silicon film of the memory array area is patterned, and the poly silicon film of the peripheral circuit area other than this was left without alteration. As a result, the poly silicon film (1009) becomes poly silicon films 1009*a* of the memory array area and a poly silicon film 1009*b* of the peripheral circuit area (FIG. 10E).

Figure 10F:
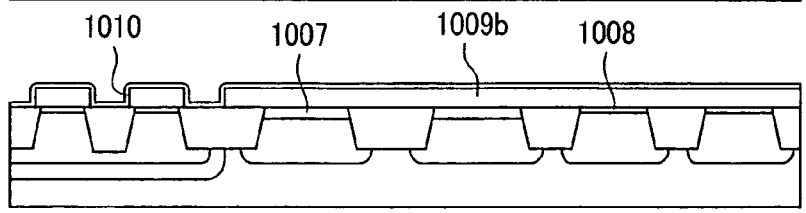

Next, an inter-poly silicon insulator film (1010) of an ONTO structure was formed. First, a silicon dioxide film that will become an O layer at an interface with the floating gates was formed to a thickness of 2 nm by a thermal CVD method using silane and nitrous oxide. Next, a silicon nitride film that will become an N layer was formed to a thickness of 4 nm by the thermal CVD method using silane and ammonia. Next, tantalum pentoxide of a T layer was formed to a thickness of 10 nm by the thermal CVD method using tantalum pentaethoxide and oxygen, and then annealed in oxygen for five minutes at 800° C., for crystallization. A silicon dioxide film that will become an O layer at the interface with the control gates was formed to a thickness of 3 nm by the thermal CVD method using silane and nitrous oxide. By the steps described above, the inter-poly insulator film (1010) having the ONTO structure was formed. Incidentally, since the peripheral circuit area is covered with the poly silicon film (1009*b*), tantalum atoms will not arrive close to the gate insulator films (1007, 1008) of transistors (FIG. 10F).

Then, a phosphorous-doped poly silicon film (1011), which will become the control gates was deposited to a thickness of 200 nm (FIG. 11A).

This poly silicon film (1011) was patterned by the known lithography and dry etching technique to form control gates (1010*a*) of the memory cells, and then an unnecessary portion of the ONTO film (1010) was removed. With this arrangement, the peripheral circuit area becomes the state where the poly silicon layer (1009*b*) was exposed (FIG. 11B).

Next, the poly silicon layer (1009*b*) was processed by the known lithography and dry etching technique to form gate electrodes in the peripheral circuit area. This makes the poly silicon layer (1009*b*) gate electrodes (1009*c*). On this occasion, the memory array area is brought into the state not covered with the photo resist, so that the poly silicon layer (1009*a*) will become floating gates (1009*d*) (FIG. 11C).

Next, by ion implantation, source/drain regions (1112) of the transistors of the peripheral circuit area and source/drain regions of the memory array area were formed (FIG. 11D). Though the source/drain regions of memory array area are not illustrated for convenience in regard to sectional views, the source/drain regions of the memory array area correspond to regions indicated by reference numerals 301 and 302 in FIG. 3.

Thereafter, after an intermetal dielectric was formed and contact holes for word lines and the transistors in the peripheral circuit area were opened, a wiring layer was formed. Though the wiring layer is not illustrated in FIG. 11D, the wiring layer corresponds to regions indicated by reference numerals 112 and 303 in FIG. 3.

Incidentally, though the thickness of the O layer at the interface with the floating gates was set to 2 nm, the thickness of the N layer was set to 4 nm, the thickness of the T layer was set to 10 nm, and the thickness of the O layer at the interface with the control gates were set to 3 nm, it needs not to say that other thickness configurations may become an optimal selection in view of its relative relationship with an operating voltage and the thickness of a tunnel dielectric. In this case, it is preferable that the thickness of the O layer at the interface with the floating gates is set in the range from 1 nm to 5 nm, the thickness of the N layer is set in the range from 1.5 nm to 10 nm, the thickness of the T layer is set in the range from 3 nm or larger, and the thickness of the O layer at the interface with the control gates is set in the range from 2 nm to 5 nm.

Especially when the thickness of the N layer was set to less than 1.5 nm, a phenomenon was found in which the N layer was completely oxidized at the time of crystallization of tantalum pentoxide to lose its oxidation resistance, so that the oxygen that has passed through the silicon dioxide film oxidized poly silicon. For this reason, it was necessary to set the thickness of the N layer to at least 1.5 nm or preferably 2 nm or larger. In order to reduce a leakage current in low electrical field, the lower limit of the thickness of the O layer at the interface with the control gates was 2 nm, which was approximately 1 nm thicker than that of the O layer at the interface with the floating gates. When its thickness was set to equal to or less than this, the leakage current in low electrical field increased as in the ONT structure in FIG. 7, which was not applicable.

Though the thermal CVD that uses most common precursors was employed as the method of manufacturing the respective layers, other manufacturing technique can also be applied. For the O layer and the N layer, for example, a plasma CVD method, the oxidization method and direct nitridation method of the silicon film, and the CVD method that uses materials other than silane, such as tetraethoxy silane could be applied. Especially when the silicon nitride layer was set to 3 nm or less, the method of performing direct nitridation of the poly silicon film or the silicon dioxide film formed by the CVD was preferable. As this direct nitridation, the thermal nitridation method of performing annealing at an atmosphere mainly constituted from ammonia for approximately 10 minutes at 700° C. and the method of performing a process in nitrogen plasma for approximately five minutes at 400° C. were effective.

The film of tantalum pentoxide of the T layer could also be formed by reactive sputtering, and nitrous oxide and ozone could also be employed for crystallization. In order to obtain the effects of the present invention, it is essential to crystallize tantalum pentoxide. An annealing temperature necessary for this was 700° C. or higher, and sufficient crystallization did not take place at a temperature equal to this or lower. A preferred temperature differed according to an oxidizing agent. When oxygen was employed as the oxidizing agent, the preferred temperature was 800° C., and when nitrous oxide was employed, the preferred temperature was 750° C. By adding niobium to the tantalum pentoxide, the temperature of crystallization in oxygen could also be reduced to 700° C. or lower. Further, the method of depositing the tantalum pentoxide a plurality of times has the effect of reducing defects in tantalum pentoxide in particular, which was effective in improving manufacturing yields of the nonvolatile memory device. When the thickness of the tantalum pentoxide film was set to 15 nm, a 5-nm film was first deposited for crystallization, and then a 10-nm film was deposited again for crystallization. By separating deposition of tantalum pentoxide in the second time into two stages and repeating deposition of the 5-nm film and crystallization three times, the effect of improving the yields can also be obtained.

Second Embodiment

In this embodiment, other embodiment is disclosed in which by avoiding exposure of the gate insulator films of the transistors in the peripheral circuit and the interfaces with silicon at the time of deposition of the tantalum pentoxide film of the ONTO structure and performing crystallization in a state where they are covered with poly silicon, the characteristic such as leakage current at the standby time of the transistors in the peripheral circuit was improved. This embodiment is the example in which a memory cell configuration popularly called as an AND type was adopted.

Main portions of manufacturing steps of a nonvolatile semiconductor memory device in this embodiment are shown in FIGS. 12A to 12F and FIGS. 13A to 13F, and FIGS. 14A to 14D. As in the first embodiment, the memory array area, peripheral circuit area, high-voltage devices, and low voltage devices were displayed with the arrows on top. Further, as in the first embodiment, sections of the memory array area parallel to a word line (a control gate line) and sections of the peripheral circuit area vertical to the gates of the transistors in the peripheral circuit area are shown.

Figure 12A:
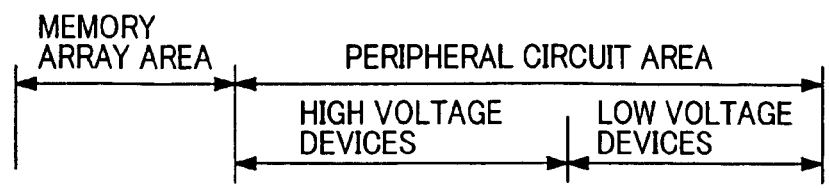
FIGS. 12A to 12F are diagrams showing manufacturing steps according to a preferred embodiment of the present invention.

The manufacturing method is as follows:

First, the isolation regions (1002) for isolating memory cells and the transistors in the peripheral circuit area are formed in the p-type silicon substrate (1001) with the [100] surface orientation (FIG. 12A).

Figure 12B:
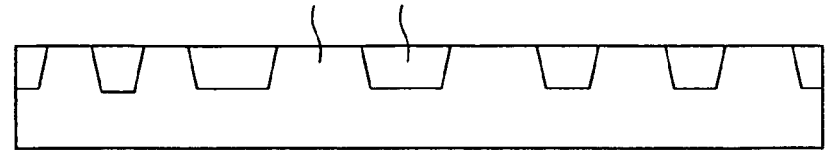

Next, by ion implantation, the memory cell isolation regions (1003), P-well regions (1004), and N-well regions (1005) were formed (FIG. 12B).

Figure 12C:
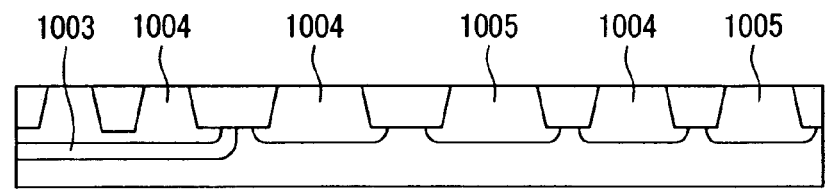

Then, tunnel dielectrics (1006) for the memory cells, gate insulator films (1007) for the peripheral circuit high voltage devices, and gate insulator films (1008) for the peripheral circuit low voltage devices were formed by thermal oxidation. First, the 30-nm silicon dioxide film was formed over the entire surface by the thermal oxidation method. Next, after the high voltage devices were covered with the photo resist (not shown) by the known lithography technique, the film thickness of the memory array area and the low voltage devices were reduced with buffered HF to a thickness of 9 nm (FIG. 12C).

Figure 12D:
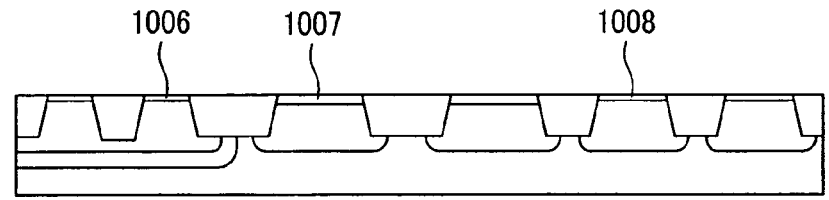

Next, a phosphorous-doped poly silicon film (1201), which will become a contamination protecting film for floating gates and the peripheral circuit was deposited to a thickness of 150 nm (FIG. 12D).

Figure 12E:
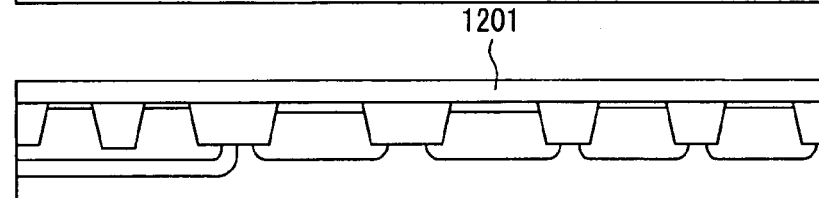

This poly silicon film was patterned using the known lithography and dry etching technique. At this step, only the poly silicon film of the memory array area was patterned, and the poly silicon film of the peripheral circuit area other than this was left without alteration. As a result, the poly silicon film (1201) becomes poly silicon films 1201a of the memory array area and a poly silicon film 1201b of the peripheral circuit area (FIG. 12E).

Figure 12F:
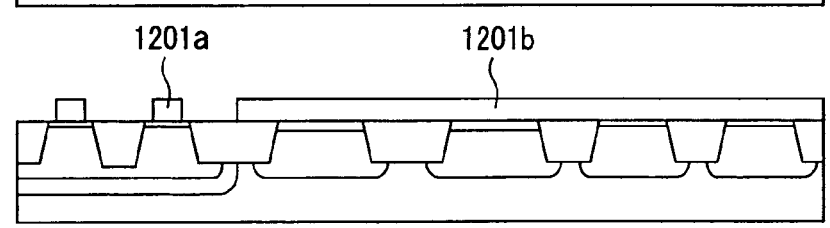

Next, by ion implantation, source/drain regions of the memory array area were formed (FIG. 12F).

Figure 13A:
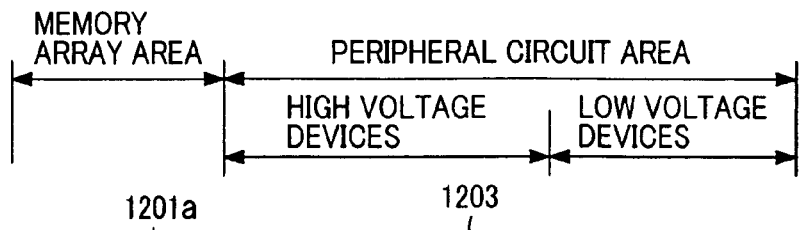
FIGS. 13A to 13F are diagrams showing manufacturing steps according to a preferred embodiment of the present invention.

Then, a silicon dioxide film (1203) was deposited to completely fill spacings between the poly silicon (1201a) of the memory array area (FIG. 13A).

Figure 13B:
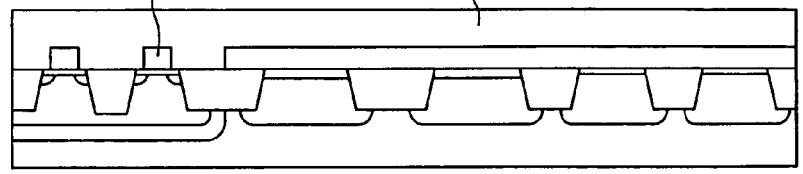

This silicon dioxide film (1203) was polished by known chemical-mechanical polishing to expose the poly silicon (1201a, 1201b) to the surface (FIG. 13B).

Figure 13C:
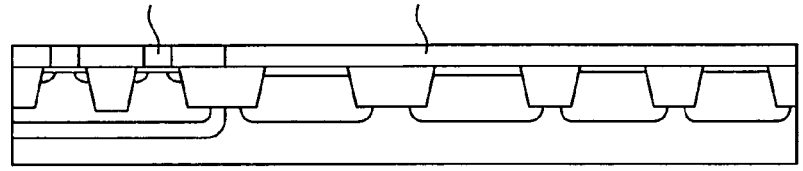

Next, a phosphorous-doped poly silicon film (1204), which is the second poly silicon film and which will become the floating gates was deposited to a thickness of 50 nm (FIG. 13C).

Figure 13D:
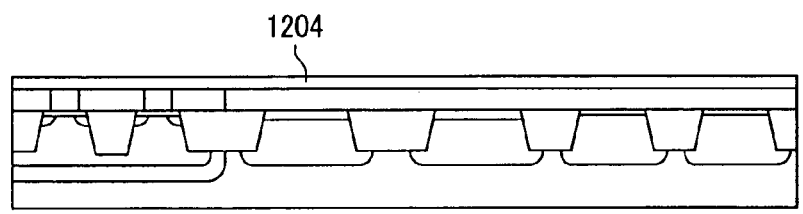

This poly silicon film was patterned by the known lithography and dry etching. As a result, the poly silicon film (1204) becomes poly silicon films 1204a (FIG. 13D).

Figure 13E:
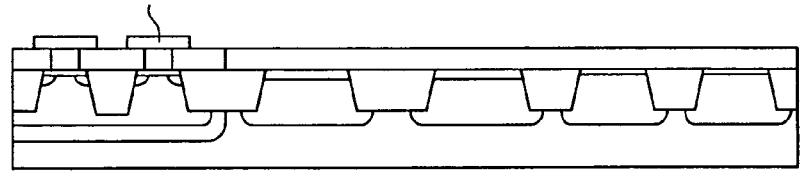

Next, the inter-poly silicon insulator film (1010) of the ONTO structure was formed. First, the silicon dioxide film that will become the O layer at the interface with the floating gates was formed to a thickness of 2 nm by the thermal CVD method using silane and nitrous oxide. Next, the silicon nitride film that will become the N layer was formed to a thickness of 4 nm by the thermal CVD method using monosilane and ammonia. Next, tantalum pentoxide of the T layer was formed to a thickness of 10 nm by the thermal CVD method using tantalum pentaethoxide and oxygen, and then annealed in oxygen for five minutes at 800° C., for crystallization. The silicon dioxide film that will become the O layer at the interface with the control gates was formed to a thickness of 3 nm by the thermal CVD method using silane and nitrous oxide. By the steps described above, the inter-poly insulator film (1010) of the ONTO structure was formed. Incidentally, since the peripheral circuit area is covered with the poly silicon film (1201b), tantalum atoms will not arrive close to the gate insulator films (1007, 1008) of the transistors (FIG. 13E).

Figure 13F:
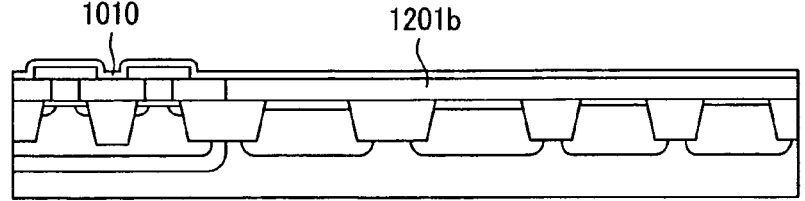

Next, the inter-poly insulator film (1010) of the ONTO structure in the area other than the memory area was removed by the known lithography and dry etching (FIG. 13F).

Figure 14A:
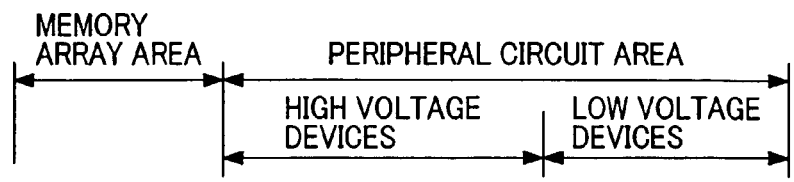
FIGS. 14A to 14D are diagrams showing manufacturing steps according to a preferred embodiment of the present invention.

Further, using the same pattern, the poly silicon (1201b) that remained in the peripheral circuit area was removed by dry etching (FIG. 14A).

Figure 14B:
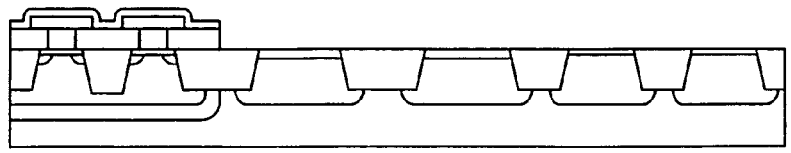

Then, a phosphorous-doped poly silicon film (1205), which will become control gates was deposited to a thickness of 20 nm (FIG. 14B).

Figure 14C:
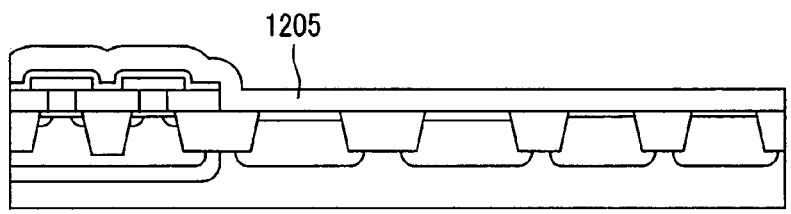

This poly silicon film (1205) was patterned by the known lithography and dry etching technique to form control gates (1205a) of the memory cells. At this point, in the peripheral circuit area, the poly silicon layer (1205) was simultaneously processed into the pattern of the gate electrodes of the transistors, thereby becoming gate electrodes 1205b (FIG. 14C).

Further, unnecessary portions of the ONTO film (1010) in the memory array area was removed, and then the poly silicon layer (1204a) was removed. For convenience in writing the sections, this processing is not illustrated. With this arrangement, the poly silicon layer (1204a) is processed into the floating gates.

Figure 14D:
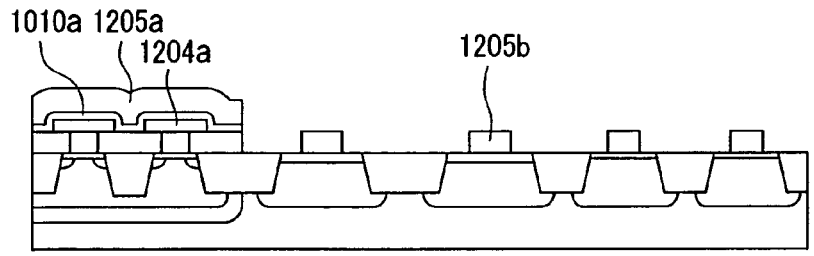

Next, by ion implantation, the source/drain regions (1112) of the transistors in the peripheral circuit area were formed (FIG. 14D).

Then, after the intermetal dielectric was formed and the contact holes for the word lines and the transistors in the peripheral circuit area were opened, the wiring layer was formed (not shown).

As described above, compared with the conventional ONO structure and a conventional OTO structure, according to this embodiment, the inter-poly insulator film between the floating gate and the control gate can be reduced due to ONTO structure, with the performance of the peripheral circuit maintained. The effect of this embodiment is comparable to that in the first embodiment. However, an AND memory cell structure in this embodiment is the structure especially suited to large-capacity, highly-integrated memory cells; so that the effect of the present invention for facilitating implementation of multi-value cells is noteworthy.

Incidentally, in this embodiment as well, it is needless to say that other method noted in the first embodiment can be applied as a method of forming the ONTO structure or selecting the film thickness of the ONTO structure.

Third Embodiment

In this embodiment, other embodiment is disclosed in which by avoiding exposure of the gate insulator films of the transistors in the peripheral circuit and the interfaces with silicon at the time of deposition of tantalum pentoxide of the ONTO structure and performing crystallization in a state where they are covered with poly silicon, the characteristic such as leakage current at the standby time of the transistors in the peripheral circuit was improved. In this embodiment, third gates that are different from the floating gates and the control gates, (which will be hereinafter referred to as assist gates), are disposed in the memory array area, thereby separating the memory cells.

Main portions of manufacturing steps of a nonvolatile semiconductor memory device in this embodiment are shown in FIGS. 15A to 15F and FIGS. 16A to 16F, and FIGS. 17A to 17C. As in the first embodiment, the memory array area, peripheral circuit area, high voltage devices, and low voltage devices were displayed with the arrows on top. Further, as in the first embodiment, sections of the memory array area parallel to a word line (a control gate line) and sections of the peripheral circuit area vertical to the gates of the transistors in the peripheral circuit area are shown.

Figure 15A:
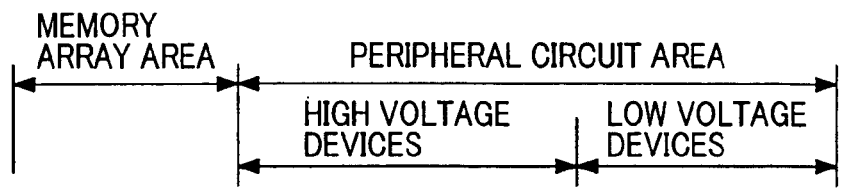
FIGS. 15A to 15F are diagrams showing manufacturing steps according to a preferred embodiment of the present invention.

The manufacturing method is as follows:

First, the isolation regions (1002) for isolating memory cells and the transistors in the peripheral circuit area are formed in the p-type silicon substrate (1001) with the [100] surface orientation (FIG. 15A).

Figure 15B:
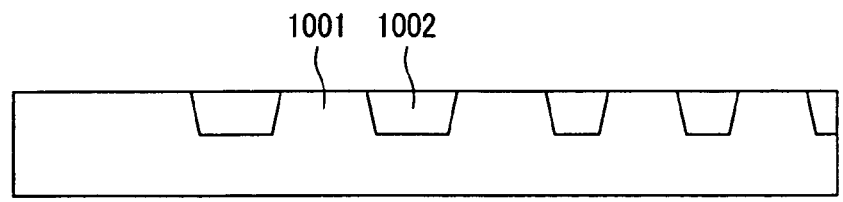

Next, by ion implantation, the memory cell isolation regions (1003), P-well regions (1004), and N-well regions (1005) were formed (FIG. 15B).

Figure 15C:
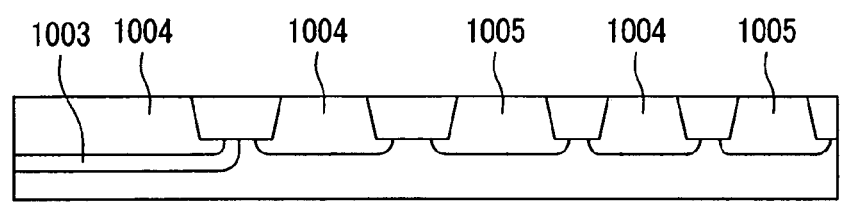

Then, a silicon dioxide film (1501) that will become tunnel dielectrics for the memory cells and gate insulator films under the assist gates, gate insulator films (1007) for the peripheral circuit high voltage devices, and gate insulator films (1008) for the peripheral circuit low voltage devices were formed by thermal oxidation. First, the 30-nm silicon dioxide film was formed over the entire surface by the thermal oxidation method. Next, after the high voltage devices were covered with the photo resist (not shown) by the known lithography technique, the film thickness of the memory array area and the low voltage devices were reduced with buffered HF to a thickness of 9 nm (FIG. 15C).

Figure 15D:
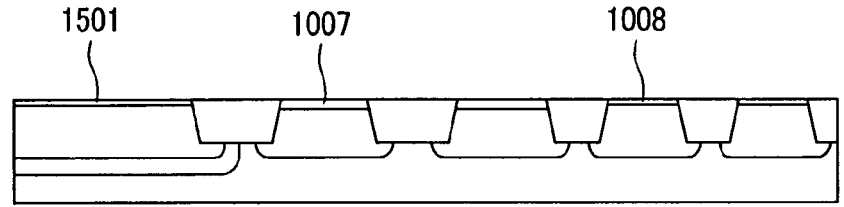

Next, a phosphorous-doped poly silicon film (1502), which will become assist gate electrodes and the gate electrodes for the transistors in the peripheral circuit was deposited to a thickness of 60 nm, and then a silicon dioxide film (1503) was further deposited to a thickness of 150 nm (FIG. 15D).

Figure 15E:
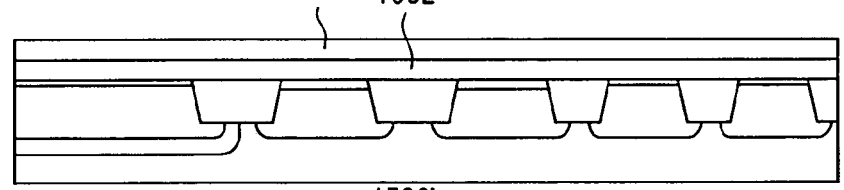

This poly silicon film was patterned using the known lithography and dry etching technique. At this step, only the poly silicon film of the memory array area was patterned, and the poly silicon film and the silicon dioxide film of the peripheral circuit area other than this were left without alteration. As a result, the poly silicon film (1502) and the silicon dioxide film (1503) will become poly silicon films 1502a and silicon dioxide films 1503a of the memory array area, respectively and a poly silicon film 1502b and a silicon dioxide film 1503b of the peripheral circuit area, respectively (FIG. 15E).

Figure 15F:
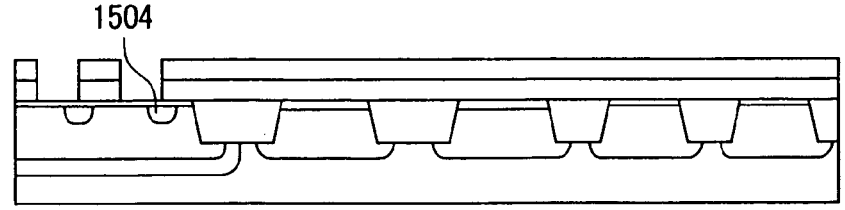

Next, by a tilted angle implantation method, source/drain regions (1504) of the memory array area were formed (FIG. 15F).

Figure 16A:
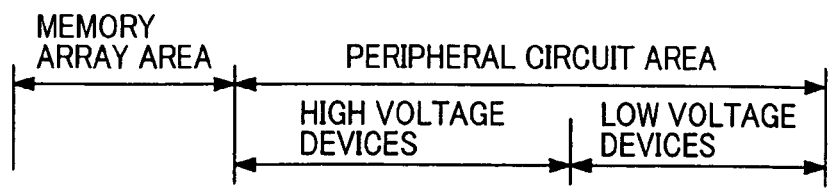
FIGS. 16A to 16F are diagrams showing manufacturing steps according to a preferred embodiment of the present invention.

Then, a silicon dioxide film (1505) was deposited to a thickness of 40 nm by the CVD method (FIG. 16A).

Figure 16B:
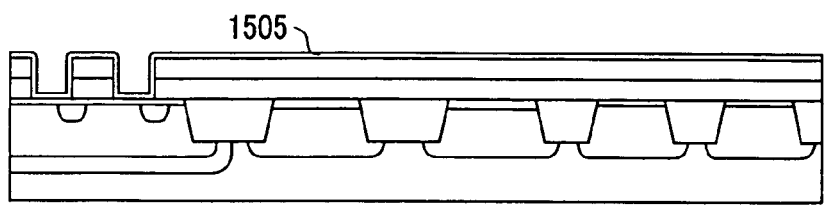

This silicon dioxide film was generally processed by the known dry etching method, and only portions of the silicon dioxide film on stepped side walls in the memory array area were left. As a result, the silicon dioxide film (1505) becomes silicon dioxide films 1505a (FIG. 16B).

Figure 16C:
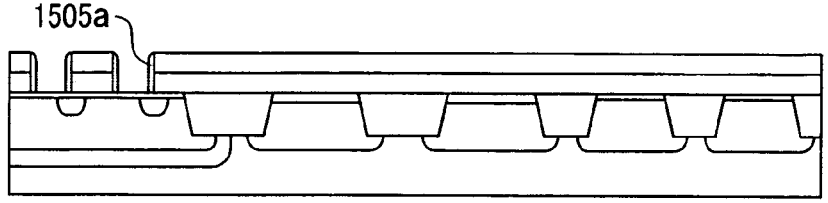

Next, a phosphorous-doped poly silicon film (1506), which will become the floating gates was deposited to a thickness of 40 nm (FIG. 16C).

Figure 16D:
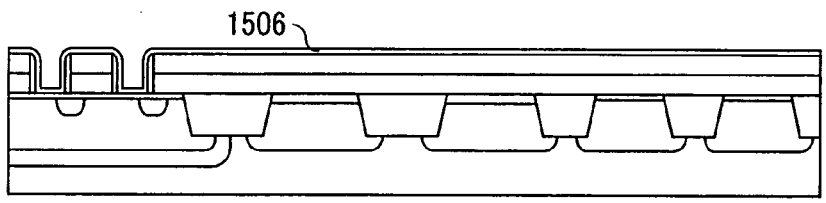

A photo resist was applied to the poly silicon film so as to completely fill grooves left between the assist gates, and this was overall processed by dry etching to leave the photo resist only on the grooves between the assist gates (not shown). With this photo resist as a mask, the poly silicon film (1506) was further dry etched. As a result, the poly silicon film (1506) remains only on the grooves between the assist gates, and becomes poly silicon films 1506a (FIG. 16D).

Next, the inter-poly silicon insulator film (1010) of the ONTO structure was formed. First, the silicon dioxide film that will become the O layer in the interface with the floating gates was formed to a thickness of 2 nm by the thermal CVD method using silane and nitrous oxide. Next, the silicon nitride film that will become the N layer was formed to a thickness of 4 nm by the thermal CVD method using monosilane and ammonia. Next, tantalum pentoxide of the T layer was formed to a thickness of 10 nm by the thermal CVD method using tantalum pentaethoxide and oxygen, and then annealed in oxygen for five minutes at 800° C., for crystallization. The silicon dioxide film of the O layer at the interface with the control gates was formed to a thickness of 3 nm by the thermal CVD method using silane and nitrous oxide. By the steps described above, the inter-poly insulator film (1010) having the ONTO structure was formed.

Figure 16E:
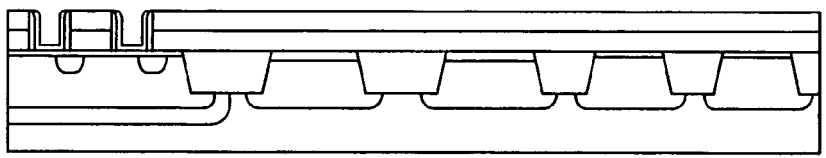

Incidentally, since the peripheral circuit area is covered with the poly silicon film (1502b) and the silicon dioxide film (1503b), tantalum atoms will not arrive close to the gate insulator films (1007, 1008) of the transistors (FIG. 16E).

Figure 16F:
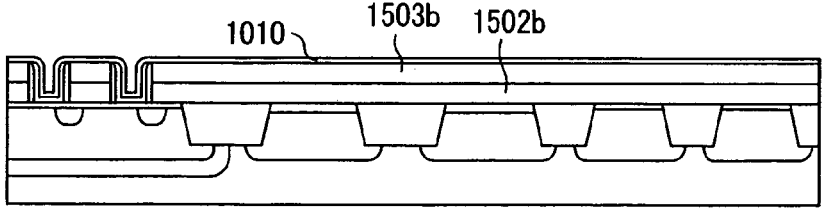

Next, a phosphorous-doped poly silicon film (1507), which will become the control gates was deposited to a thickness of 200 nm (FIG. 16F).

Figure 17A:
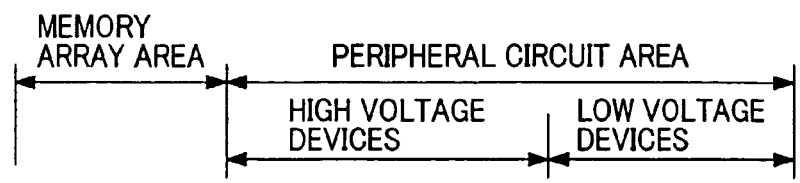
FIGS. 17A to 17C are diagrams showing manufacturing steps according to a preferred embodiment of the present invention.

This poly silicon film (1507) was patterned by the known lithography and dry etching technique to form control gates (1507a) of the memory cells. At this point, it was so arranged that an etching mask was not formed in the peripheral circuit area, and the poly silicon film (1507) was removed. Then, the unnecessary portion of the ONTO film (1010) was removed using the same etching mask. As a result, the ONTO film becomes the film 1010a (FIG. 17A).

Figure 17B:
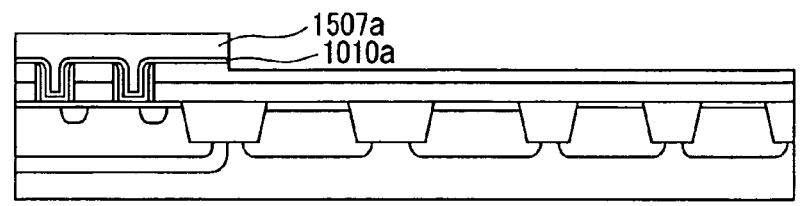

Next, the silicon dioxide film (1502b) and the poly silicon (1503b) were processed into the gate electrodes of the transistors in the peripheral circuit area by the known lithography and dry etching. As a result, the silicon dioxide film and the poly silicon become a silicon dioxide film 1502c and poly silicon 1503c, respectively (FIG. 17B). At this point, it was so arranged that the etching mask was not present in the memory array area. First, the silicon dioxide film was completely etched, and then the poly silicon was etched. For convenience in writing the sections, processing of the memory array area is not illustrated. This makes the poly silicon layer (1506a) to be processed into the floating gates.

Figure 17C:
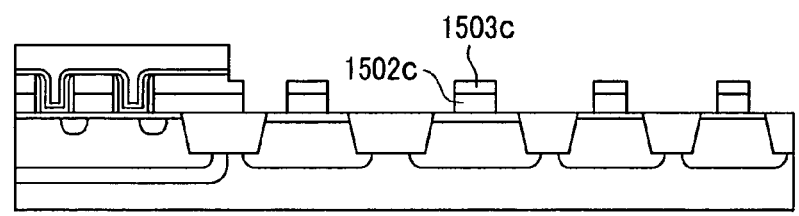

Next, by ion implantation, the source/drain regions (1112) of the transistors in the peripheral circuit area were formed (FIG. 17C).

Thereafter, the intermetal dielectric was formed, the contact holes for the word lines and the transistors in the peripheral circuit area were opened, and then the wiring layer was formed (not shown).

As described above, according to this embodiment, compared with the conventional ONO structure and the OTO structure, the thickness of the inter-poly insulator film between the floating gate and the control gate can be reduced due to the ONTO structure, with the performance of the peripheral circuit maintained. The effect of this embodiment is comparable to that in the first embodiment. However, an AND memory cell structure with the assist gate in this embodiment is the structure especially suited for large-capacity, highly-integrated memory cells because miniaturization of the memory cells is easy. Thus, the effect of the present invention for facilitating implementation of multi-value cells is noteworthy.

Incidentally, in this embodiment as well, it is needless to say that other method noted in the first embodiment can be applied as a method of forming the ONTO structure or selecting the film thickness of the ONTO structure.

Fourth Embodiment

Differing from the first to third embodiments, this embodiment shows a preferred embodiment that actively utilizes the ONTO structure for the gate insulator films of the transistors in the peripheral circuit. This embodiment, in particular, is an example where the gate insulator films of the ONTO structure are used for the transistors of the high voltage devices that uses thick gate insulator films. In this embodiment, the memory cell configuration popularly referred to the AND type was adopted.

Main portions of manufacturing steps of a nonvolatile semiconductor memory device in this embodiment are shown in FIGS. 18A to 18F and FIGS. 19A to 19F, and FIGS. 20A to 20E. As in the first embodiment, the memory array area, peripheral circuit area, high voltage devices, and low voltage devices were displayed with the arrows on top. Further, as in the first embodiment, sections of the memory array area parallel to a word line (a control gate line) and sections of the peripheral circuit area vertical to the gates of the transistors in the peripheral circuit area are shown.

Figure 18A:
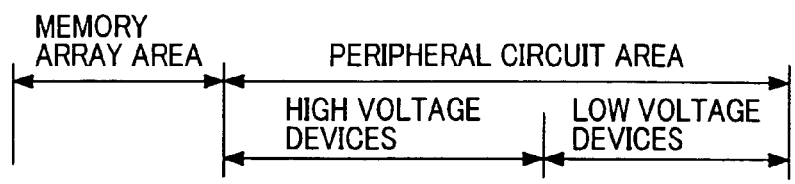
FIGS. 18A to 18F are diagrams showing manufacturing steps according to a preferred embodiment of the present invention.

The manufacturing method is as follows:

First, the isolation regions (1002) for isolating memory cells and the transistors in the peripheral circuit area are formed in the p-type silicon substrate (1001) with the [100] surface orientation (FIG. 18A).

Figure 18B:
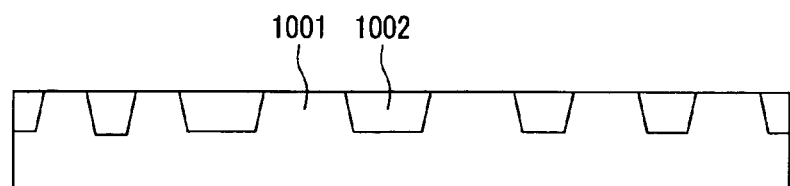

Next, by ion implantation, the memory cell isolation regions (1003), P-well regions (1004), and N-well regions (1005) were formed (FIG. 18B).

Figure 18C:
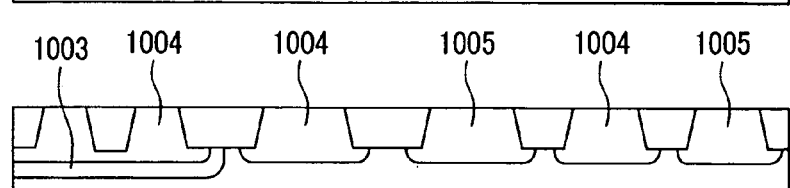

Then, the tunnel dielectrics (1006) for the memory cells, a silicon surface protection oxide film (1801) for the high voltage devices in the peripheral circuit, and the gate insulator films (1008) for the low voltage devices in the peripheral circuit were formed by thermal oxidation. The thickness was set to 9 nm (FIG. 18C).

Figure 18D:
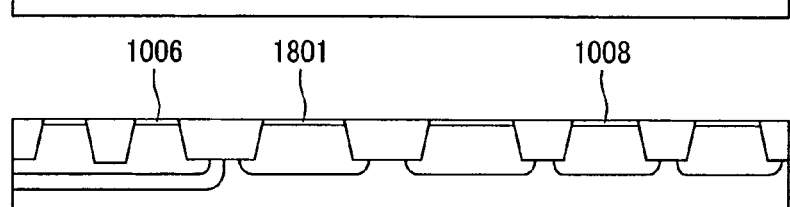

Next, a phosphorous-doped poly silicon film (1802), which will become the floating gates and a contamination protection film for the low voltage devices in the peripheral circuit was deposited to a thickness of 150 nm (FIG. 18D).

Figure 18E:
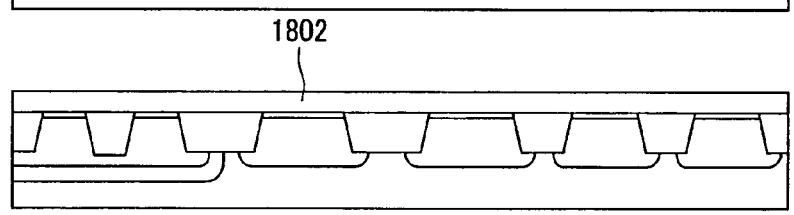

This poly silicon film was patterned using the known lithography and dry etching technique. At this step, only the poly silicon film of the memory array area was patterned, and the poly silicon film of the peripheral circuit area other than this was left without alteration. As a result, the poly silicon film (1802) will become poly silicon films 1802a of the memory array area and a poly silicon film 1802b of the peripheral circuit area (FIG. 18E).

Figure 18F:
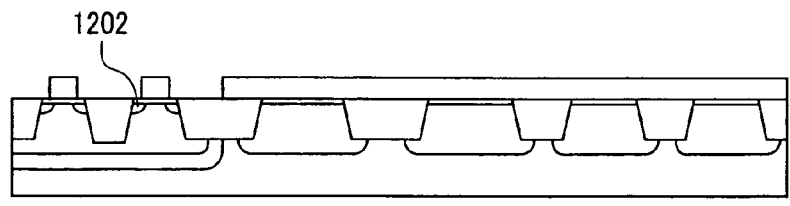

Next, by ion implantation, the source/drain regions (1202) of the memory array area were formed (FIG. 18F).

Figure 19A:
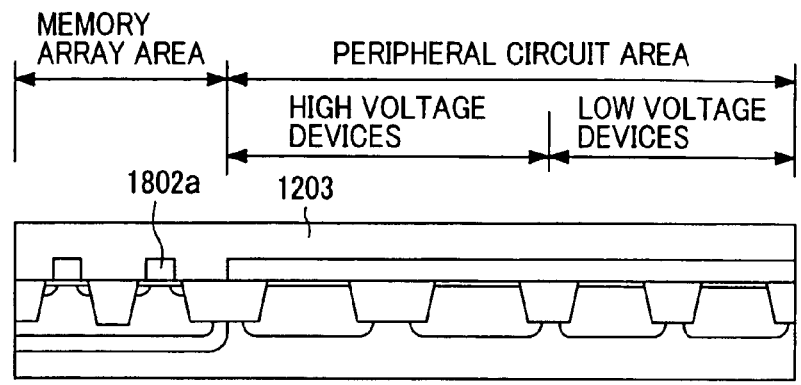
FIGS. 19A to 19F are diagrams showing manufacturing steps according to a preferred embodiment of the present invention.

Then, the silicon dioxide film (1203) was deposited to completely fill spacings between the poly silicon (1802*a*) of the memory array area (FIG. 19A).

Figure 19B:
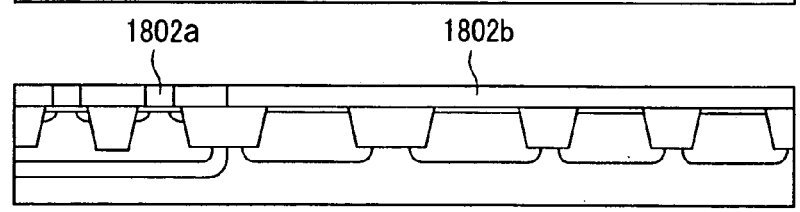

This silicon dioxide film was polished by the known chemical-mechanical polishing to expose the poly silicon (1802*a*, 1802*b*) to the surface (FIG. 19B).

Figure 19C:
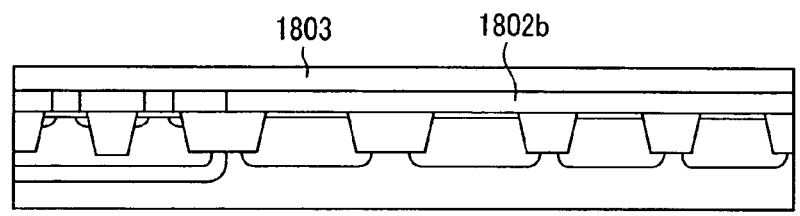

Next, a phosphorous-doped poly silicon film (1803), which will become second floating gates was deposited to a thickness of 50 nm. As a result, two layers of the poly silicon films 1802*b* and 1803 are laminated in the peripheral circuit area (FIG. 19C).

Figure 19D:
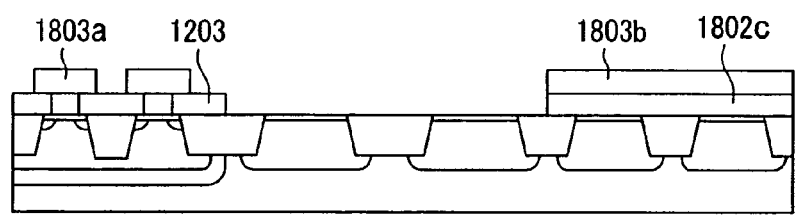

These two layers of the poly silicon films were patterned by the known lithography and dry etching. It was arranged that the low voltage devices in the peripheral circuit area had the pattern that was not dry etched. Incidentally, since the memory array area is a multilayer structure of the poly silicon (1803) and the silicon dioxide film (1203), only the upper poly silicon (1803) is patterned. As a result, the poly silicon films (1803)(1802*b*) become poly silicon films 1803*a* and 1803*b*, and a silicon film 1802*c*, respectively (FIG. 19D).

Figure 19E:
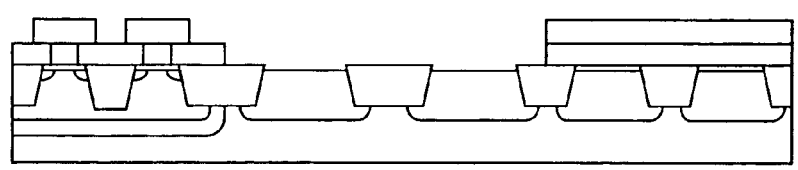

Next, by buffered HF, the protection film (1801) for the high voltage devices in the peripheral circuit was removed, thereby exposing the surface of silicon (FIG. 19E).

Figure 19F:
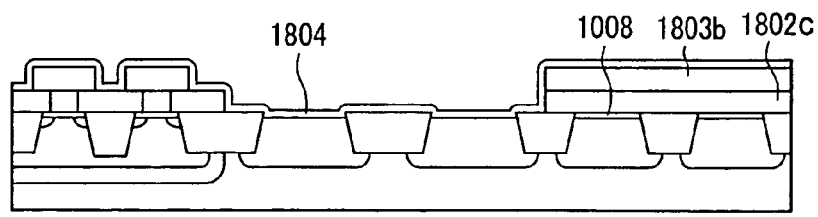

Next, an inter-poly silicon insulator film (1804) of the ONTO structure was formed. First, the silicon dioxide film that will become the O layer at the interface with the floating gates was formed to a thickness of 2 nm by the thermal CVD method using silane and nitrous oxide. Next, the silicon nitride film that will become the N layer was formed to a thickness of 4 nm by the thermal CVD method using monosilane and ammonia. Next, tantalum pentoxide of the T layer was formed to a thickness of 10 nm by the thermal CVD method using tantalum pentaethoxide and oxygen, and then annealed in oxygen for five minutes at 800° C., for crystallization. The silicon dioxide film that will become the O layer at the interface with the control gates was formed to a thickness of 3 nm by the thermal CVD method using silane and nitrous oxide. By the steps described above, the inter-poly insulator film (1804) of the ONTO structure was formed. This film of the ONTO structure becomes the gate insulator films for the high voltage devices in the peripheral circuit. Incidentally, the low voltage devices are covered with the poly silicon films (1803*b*, 1802*c*) as in the second embodiment, the tantalum atoms will not arrive close to the gate insulator films (1008) of the transistors (FIG. 19F).

Figure 20A:
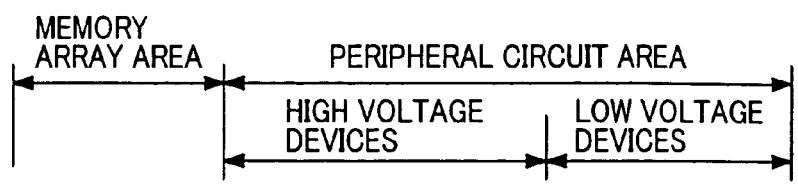
FIGS. 20A to 20E are diagrams showing manufacturing steps according to a preferred embodiment of the present invention.

Then, a phosphorous-doped poly silicon film (1805), which will become the control gates of the memory cells and the gate electrodes of the high voltage devices were deposited to a thickness of 200 nm (FIG. 20A).

Figure 20B:
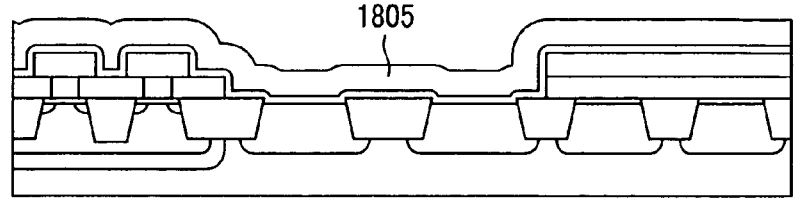

This poly silicon film was processed into the patterns for the control gates and the gate electrodes of the high voltage devices by the known lithography and dry etching. As a result, the poly silicon film (1805) becomes poly silicon films 1805*a* and 1805*b*. Incidentally, it was arranged that the poly silicon film for the low voltage devices was all removed at this point (FIG. 20B).

Figure 20C:
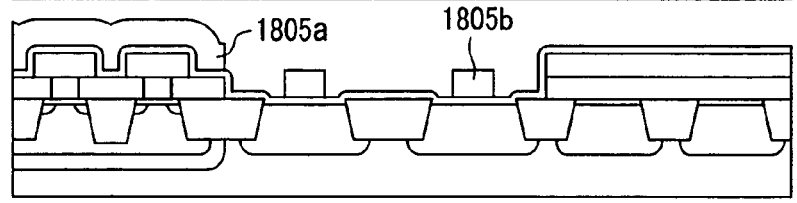

Next, a resist pattern for covering the high voltage devices in the peripheral circuit was formed (not shown), and the unnecessary portions of the ONTO film of the memory array area and the ONTO film of the low voltage devices were removed. As a result, the ONTO film (1804) becomes an ONTO film 1804*a*. Then, the second poly silicon film (1803*a*) in the memory array area was processed to form floating gates (1803*c*), and the top poly silicon (1803*b*) of the low voltage devices were removed (FIG. 20C).

Figure 20D:
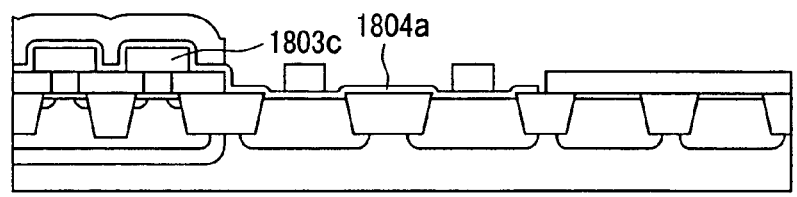

Further, by the known lithography and dry etching, the poly silicon (1802*c*) of the low voltage devices in the peripheral circuit area is patterned into the gate electrodes. As a result, the poly silicon 1802*c* becomes gate electrodes 1802*d* (FIG. 20D).

Figure 20E:
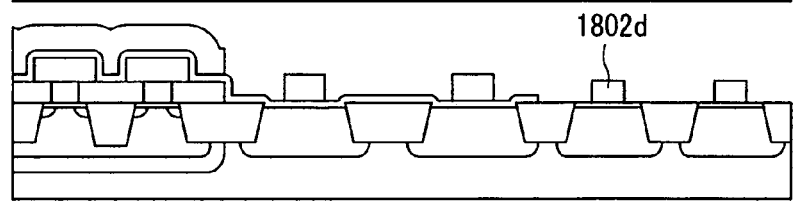

Next, by ion implantation, the source/drain regions (1012) of the transistors in the peripheral circuit area were formed (FIG. 20E).

Then, the inter-layer wiring insulator film was formed, the contact holes for the word lines and the transistors in the peripheral circuit area were opened, and the wiring layer was formed (not shown).

As described above, according to this embodiment, there is no need to form two types of gate insulator films, and reliability of the gate insulator film formed of the ONTO film is far higher than that of the silicon dioxide film, which was advantageous for miniaturization of the transistors. Further, in this embodiment, the ONTO structure could be adopted for a capacitor in an internal high voltage generating circuit, so that there was also an advantage of enabling reduction in chip area.

In this embodiment as well, it is needless to say that other method noted in the first embodiment can be applied to film thickness selection of the ONTO structure and the method of forming the ONTO structure. Further, if the ONTO structure is used, the equivalent thickness of the silicon dioxide film necessary for the gate oxide films of the low voltage devices in the peripheral circuit can be achieved by the inter-poly insulator film as well. Thus, an embodiment in which the gate insulator film of the ONTO structure is also employed for the low voltage devices was also effective.

Figure 21:
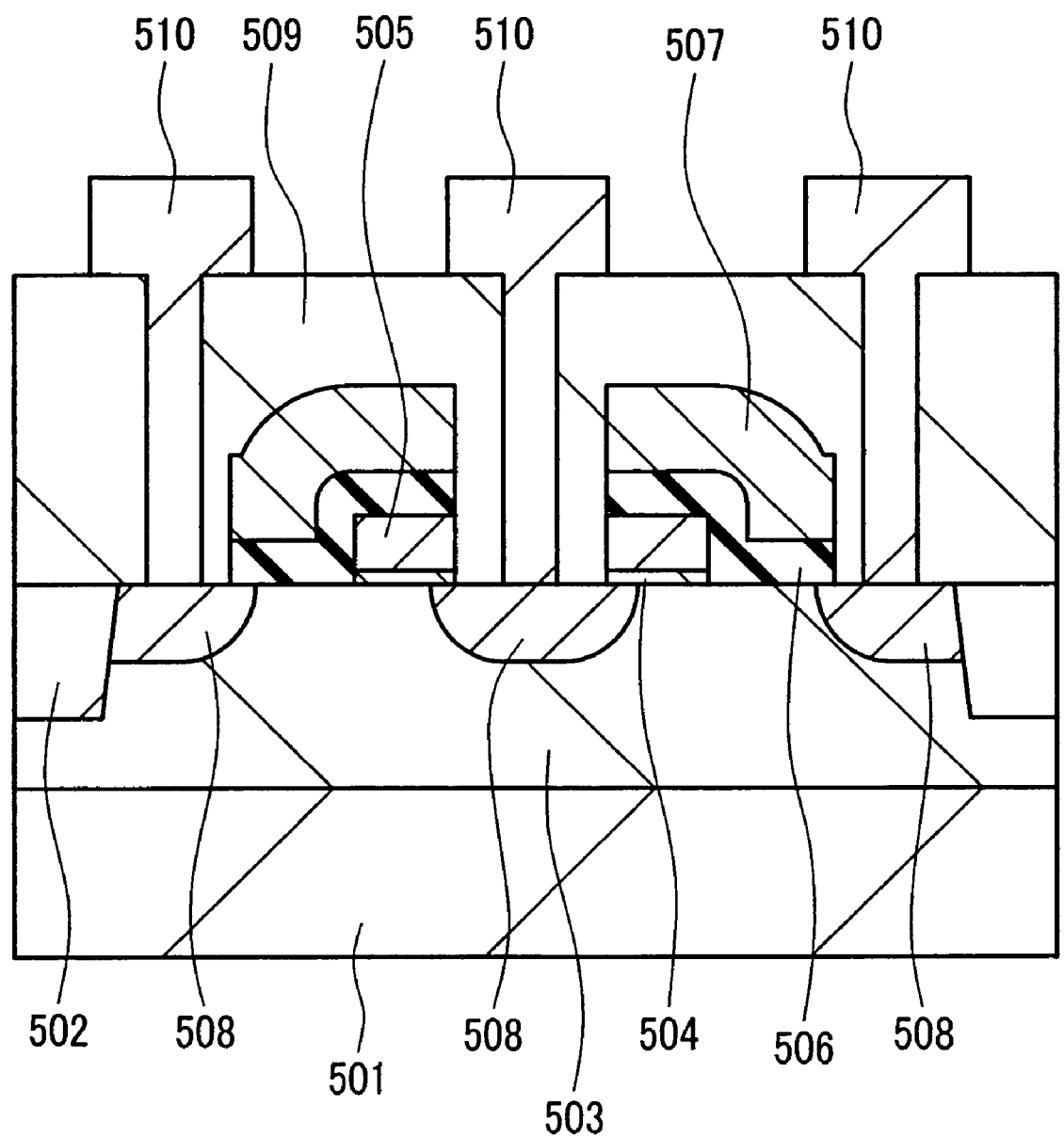
FIG. 21 is a sectional view in a direction parallel to a word line of a memory array area of a nonvolatile semiconductor memory device according to an embodiment of the present invention.

The preferred embodiments of the present invention were disclosed, based on the four examples described above. All of these examples employ the memory cells called a stack gate type. Large capacitance, the low leakage current in a low electric field, and high reliability of the ONTO structure were effective when employed as an insulator film between the floating gate and the control gate of a split gate type flash memory cell and an insulator film between the erasing gate and the floating gate of the split gate type flash memory cell. FIG. 21 showed its one example and showed the section of a memory array area. As the method of fabricating the peripheral circuit area, the method of using the floating gates as barriers against tantalum element contamination as in the first embodiment and using the control gates as the gate electrodes of the peripheral circuit area, or the method of using ONTO structures as the gate insulator films of the transistors in the peripheral circuit as in the fourth embodiment are effective. The method of fabricating the ONTO structure is performed in the same way as in the first embodiment. In the split gate structure, in particular, which uses stepped side walls of the floating gate, formation of a uniform film thickness and quality is performed by using the technique of the present invention that facilitates manufacture using the CVD. For this reason, the embodiments are also effective means for higher integration, which is the challenge for the split gate type cell.

Though the above description was given about the embodiments, the present invention is not limited to these, and it is clear to those skilled in the art that various changes and modifications can be made within the spirit of the present invention and appended claims.

INDUSTRIAL APPLICABILITY

According to one aspect of the present invention, due to an ONTO structure, the thickness of an inter-poly insulator film between a floating gate and a control gate can be reduced more than in the conventional ONO structure and the conventional OTO structure, with the performance of a peripheral circuit maintained. In a nonvolatile semiconductor memory device having a structure in which a capacitor C1 formed of the control gate, inter-poly insulator film, and floating gate is connected in series with a capacitor C2 formed of the floating gate, a tunnel dielectric, and a channel, this increases a C1-to-C2 ratio, resulting in more efficient propagation of a potential given to the control gate to the floating gate.

As one effect on the nonvolatile semiconductor memory device thereby obtained, reduction in a write/erasure voltage can be pointed out. This resulted in reduction in the burden on the high voltage devices and the high voltage generating circuit, thereby enabling reduction in chip area and reduction in power consumption.

As other effect obtained by the present invention, when the write/erasure voltage was fixed, a voltage applied to C2 increases. This enabled the tunnel dielectric to become relatively thicker, so that rewrite reliability of the nonvolatile memory device could be achieved.

As other effect obtained by the present invention, when the write/erasure voltage was likewise fixed, the voltage applied to C2 increases. When the tunnel dielectric was set to be the same, a time required for a write/erasure operation could be reduced, so that a faster operation could be effected.

Further, as other effect obtained by the present invention, implementation of a multiple-value cell can be pointed out. Compared with a cell with a simple threshold, a plurality of bits is stored in the multiple-value cell. Thus, reduction in chip area can be performed. However, on the other hand, a transistor threshold needs to be changed greatly. This corresponds to an increase in the amount of electrical charge stored in the floating gate, so that there is a trade-off with rewrite reliability and an operating speed. By applying the second and third advantages of the present invention to the multi-value cell, this trade-off could be solved.

Further, according to the preferred embodiment of the present invention, an inter-poly silicon insulator film formed between the floating gate and the control gate was constituted from a multilayer film having at least three layers including a first silicon dioxide layer, a layer having nitrogen and silicon as main constituent elements, and a tantalum pentoxide layer. With this configuration, tantalum pentoxide can be crystallized into a higher dielectric constant phase, and leakage current can also be reduced.

This configuration can also be applied to a structure having a first floating gate and a second floating gate electrically connected to the floating gate.

This configuration can also be applied to a structure having a third assist gate between floating gates.

This configuration can also be applied to a nonvolatile semiconductor device of a split gate type in which the control gate is also present in the same plane as the floating gate.

Further, according to other aspect of the present invention, when the inter-poly silicon insulator film including tantalum pentoxide was formed over the floating gate, in order to prevent invasion of a tantalum element into a peripheral circuit area, a poly silicon layer formed simultaneously with the floating gates was disposed over the gate insulator films of the transistors in a peripheral circuit to serve as a diffusion barrier. By removing this diffusion barrier after completion of crystallization, diffusion of the tantalum element was avoided. The control gates in a memory array area function as gate electrodes in the peripheral circuit area.

Further, according to other aspect of the present invention, when tantalum pentoxide was formed, the poly silicon layer formed simultaneously with the floating gates was disposed over the gate insulator films of the transistors in the peripheral circuit to serve as the diffusion barrier. Then, since this diffusion barrier was removed after crystallization, diffusion of the tantalum element into the peripheral circuit was avoided. For this reason, the performance of the transistors in the peripheral circuit area was enhanced.

Still further, according to other aspect of the present invention, the insulator films including tantalum pentoxide were employed as the gate insulator films and a capacitor insulator film for the transistors in the peripheral circuit area. Thus, process simplification and reduction in chip area could be achieved.

The invention claimed is:

1. A nonvolatile semiconductor memory device having a memory array area constituted from a memory cell array having a plurality of memory cells arranged in a matrix, each of the memory cells being a first MOS field effect transistor comprising a first well region formed in a semiconductor substrate, a first diffusion layer formed in the first well region, for functioning as a source or a drain, a floating gate formed over the first well region through a tunnel dielectric, and a control gate formed over the floating gate through an inter-poly silicon insulator film, wherein
the inter-poly silicon insulator film is constituted from a multilayer film including at least three layers comprising a first silicon dioxide layer, a layer having nitrogen and silicon as main constituent elements, and a tantalum pentoxide layer.

2. The nonvolatile semiconductor memory device according to claim 1, wherein the inter-poly silicon insulator film is constituted from a multilayer film including at least four layers comprising the first silicon dioxide layer, the layer having nitrogen and silicon as the main constituent elements, the tantalum pentoxide layer, and a second silicon dioxide layer.

3. The nonvolatile semiconductor memory device according to claim 1, wherein a density of a number of oxygen atoms included in the layer having nitrogen and silicon as the main constituent elements constituting the inter-poly silicon insulator film is smaller than a density of a number of nitrogen atoms therein.

4. The nonvolatile semiconductor memory device according to claim 1, wherein the first silicon dioxide layer constituting the inter-poly silicon insulator film has a thickness of 5 nm or less.

5. The nonvolatile semiconductor memory device according to claim 1, wherein the layer having nitrogen and silicon as the main constituent elements constituting the inter-poly silicon insulator film has a thickness of 1.5 nm or more.

6. The nonvolatile semiconductor memory device according to claim 2, wherein the second silicon dioxide layer constituting the inter-poly silicon insulator film has a thickness of 2 nm or more.

7. A nonvolatile semiconductor memory device having a memory array area constituted from a memory cell array having a plurality of memory cells arranged in a matrix, each of the memory cells being a first MOS field effect transistor comprising a first well region formed in a semiconductor substrate, a first diffusion layer formed in the first well region, for functioning as a source or a drain, a floating gate formed over the first well region through a tunnel dielectric, and a control gate formed over the floating gate through an inter-poly silicon insulator film, wherein the inter-poly silicon insulator film is constituted from a multilayer film and at least one layer of the multilayer film is a tantalum pentoxide layer with a dielectric constant of 50 or more.

8. The nonvolatile semiconductor memory device according to claim 7, wherein the tantalum pentoxide layer contacts floating gates through a layer including at least a silicon dioxide layer.

9. The nonvolatile semiconductor memory device according to claim 8, wherein the layer including the silicon dioxide layer constituting the inter-poly silicon insulator film includes nitrogen.

10. The nonvolatile semiconductor memory device according to claim 7, wherein the tantalum pentoxide layer contacts control gates through a layer including at least a silicon dioxide layer.

11. A nonvolatile semiconductor memory device comprising:
a memory array area constituted from a memory cell array having a plurality of memory cells arranged in a matrix, each of the memory cells being a first MOS field effect transistor comprising a first well region formed in a semiconductor substrate, a first diffusion layer formed in the first well region, for functioning as a source or a drain, a floating gate formed over the first well region through a tunnel dielectric, and a control gate formed over the floating gate through an inter-poly silicon insulator film; and
a peripheral circuit area having a plurality of second MOS field effect transistors disposed therein, each of the second MOS field effect transistors comprising a second well region formed in the semiconductor substrate, a second diffusion layer formed in the second well region, for functioning as a source or a drain, and a gate electrode formed over the second well region through a gate insulator film;
wherein the inter-poly silicon insulator film is constituted from a multilayer film including at least a tantalum pentoxide layer, and a thickness of poly silicon of gate electrodes in the peripheral circuit area is formed to be equal to a thickness of poly silicon constituting control gates in the memory array area.

12. A nonvolatile semiconductor memory device comprising:
a memory array area constituted from a memory cell array having a plurality of memory cells arranged in a matrix, each of the memory cells being a first MOS field effect transistor comprising a first well region formed in a semiconductor substrate, a first diffusion layer formed in the first well region, for functioning as a source or a drain, a floating gate formed over the first well region through a tunnel dielectric, and a control gate formed over the floating gate through an inter-poly silicon insulator film; and
a peripheral circuit area having a plurality of second MOS field effect transistors disposed therein, each of the second MOS field effect transistors comprising a second well region formed in the semiconductor substrate, a second diffusion layer formed in the second well region, for functioning as a source or a drain, and a gate electrode formed over the second well region through a gate insulator film;
wherein the inter-poly silicon insulator film is constituted from a multilayer film including at least a tantalum pentoxide layer, and at least a part of the second MOS field effect transistors use the multilayer film including the tantalum pentoxide layer as gate insulator films.

13. A nonvolatile semiconductor memory device comprising a memory array area constituted from a memory cell array having a plurality of memory cells arranged in a matrix, each of the memory cells being a first MOS field effect transistor comprising a first well region formed in a semiconductor substrate, a first diffusion layer formed in the first well region, for functioning as a source or a drain, a first floating gate formed over the first well region through a tunnel dielectric, a second floating gate electrically connected over to the first floating gate, and a control gate formed over the second floating gate through an inter-poly silicon insulator film, wherein
the inter-poly silicon insulator film is constituted from a multilayer film including at least three layers comprising a first silicon dioxide layer, a layer having nitrogen and silicon as main constituent elements, and a tantalum pentoxide layer.

14. The nonvolatile semiconductor memory device according to claim 13, wherein the inter-poly silicon insulator film is constituted from a multilayer film including at least four layers comprising the first silicon dioxide layer, the layer having nitrogen and silicon as the main constituent elements, the tantalum pentoxide layer, and a second silicon dioxide layer.

15. The nonvolatile semiconductor memory device according to claim 13, wherein a density of a number of oxygen atoms included in the layer having nitrogen and silicon as the main constituent elements constituting the inter-poly silicon insulator film is smaller than a density of a number of nitrogen atoms therein.

16. The nonvolatile semiconductor memory device according to claim 13, wherein the first silicon dioxide layer constituting the inter-poly silicon insulator film has a thickness of 5 nm or less.

17. The nonvolatile semiconductor memory device according to claim 13, wherein the layer having nitrogen and silicon as the main constituent elements constituting the inter-poly silicon insulator film has a thickness of 1.5 nm or more.

18. The nonvolatile semiconductor memory device according to claim 14, wherein the second silicon dioxide layer constituting the inter-poly silicon insulator film has a thickness of 2 nm or more.

19. A nonvolatile semiconductor memory device having a memory array area constituted from a memory cell array having a plurality of memory cells arranged in a matrix, each of the memory cells being a first MOS field effect transistor comprising a first well region formed in a semiconductor substrate, a first diffusion layer formed in the first well region, for functioning as a source or a drain, a first floating gate formed over the first well region through a tunnel dielectric, a second floating gate electrically connected over to the first floating gate, and a control gate formed over the second floating gate through an inter-poly silicon insulator film, wherein
the inter-poly silicon insulator film is constituted from a multilayer film and at least one layer of the multilayer film is a tantalum pentoxide layer with a dielectric constant of 50 or more.

20. The nonvolatile semiconductor memory device according to claim 19, wherein the tantalum pentoxide layer contacts floating gates through a layer including at least a silicon dioxide layer.

21. The nonvolatile semiconductor memory device according to claim 20, wherein the layer including the silicon dioxide layer constituting the inter-poly silicon insulator film includes nitrogen.

22. The nonvolatile semiconductor memory device according to claim 19, wherein the tantalum pentoxide layer contacts control gates through a layer including a silicon dioxide layer.

23. A nonvolatile semiconductor memory device comprising:
a memory array area constituted from a memory cell array having a plurality of memory cells arranged in a matrix, each of the memory cells being a first MOS field effect transistor comprising a first well region formed in a semiconductor substrate, a first diffusion layer formed in the first well region, for functioning as a source or a drain, a first floating gate formed over the first well region through a tunnel dielectric, a second floating gate electrically connected over to the first floating gate, and a control gate formed over the second floating gate through an inter-poly silicon insulator film; and
a peripheral circuit area having a plurality of second MOS field effect transistors disposed therein, each of the second MOS field effect transistors comprising a second well region formed in the semiconductor substrate, a second diffusion layer formed in the second well region, for functioning as a source or a drain, and a gate electrode formed over the second well region through a gate insulator film;
wherein the inter-poly silicon insulator film is constituted from a multilayer film including at least a tantalum pentoxide layer, and a film thickness of poly silicon of gate electrodes in the peripheral circuit area is formed to be equal to a film thickness of poly silicon constituting control gates in the memory array area.

24. A nonvolatile semiconductor memory device comprising:
a memory array area constituted from a memory cell array having a plurality of memory cells arranged in a matrix, each of the memory cells being a first MOS field effect transistor comprising a first well region formed in a semiconductor substrate, a first diffusion layer formed in the first well region, for functioning as a source or a drain, a first floating gate formed over the first well region through a tunnel dielectric, a second floating gate electrically connected over to the first floating gate, and a control gate formed over the second floating gate through an inter-poly silicon insulator film; and
a peripheral circuit area having a plurality of second MOS field effect transistors disposed therein, each of the second MOS field effect transistors comprising a second well region formed in the semiconductor substrate, a second diffusion layer formed in the second well region, for functioning as a source or a drain, and a gate electrode formed over the second well region through a gate insulator film;
wherein the inter-poly silicon insulator film is constituted from a multilayer film including at least a tantalum pentoxide layer, and at least a part of the second MOS field effect transistors use the multilayer film including the tantalum pentoxide layer as gate insulator films.

25. A nonvolatile semiconductor memory device having a memory array area constituted from a memory cell array having a plurality of memory cells arranged in a matrix, each of the memory cells being a first MOS field effect transistor comprising a first well region formed in a semiconductor substrate, a first diffusion layer formed in the first well region, for functioning as a source or a drain, a floating gate formed over the first well region through a tunnel dielectric, and a control gate formed over the first well region and the floating gate through an inter-poly silicon insulator film,
wherein the inter-poly silicon insulator film is constituted from a multilayer film including at least three layers comprising a first silicon dioxide layer, a layer having nitrogen and silicon as main constituent elements, and a tantalum pentoxide layer.

26. The nonvolatile semiconductor memory device according to claim 25, wherein the inter-poly silicon insulator film is constituted from a multilayer film including at least four layers comprising the first silicon dioxide layer, the layer having nitrogen and silicon as the main constituent elements, the tantalum pentoxide layer, and a second silicon dioxide layer.

27. The nonvolatile semiconductor memory device according to claim 25, wherein a density of a number of oxygen atoms included in the layer having nitrogen and silicon as the main constituent elements constituting the inter-poly silicon insulator film is smaller than a density of a number of nitrogen atoms therein.

28. The nonvolatile semiconductor memory device according to claim 25, wherein the first silicon dioxide layer constituting the inter-poly silicon insulator film has a thickness of 5 nm or less.

29. The nonvolatile semiconductor memory device according to claim 25, wherein the layer having nitrogen and silicon as the main constituent elements constituting the inter-poly silicon insulator film has a thickness of 1.5 nm or more.

30. The nonvolatile semiconductor memory device according to claim 26, wherein the second silicon dioxide layer constituting the inter-poly silicon insulator film has a thickness of 2 nm or more.

31. A nonvolatile semiconductor memory device having a memory array area constituted from a memory cell array having a plurality of memory cells arranged in a matrix, each of the memory cells being a first MOS field effect transistor comprising a first well region formed in a semiconductor substrate, a first diffusion layer formed in the first well region, for functioning as a source or a drain, a floating gate formed over the first well region through a tunnel dielectric, and a control gate formed over the first well and the floating gate through an inter-poly silicon insulator film,
wherein the inter-poly silicon insulator film is constituted from a multilayer film and at least one layer of the multilayer film is a tantalum pentoxide layer with a dielectric constant of 50 or more.

32. The nonvolatile semiconductor memory device according to claim 31, wherein the tantalum pentoxide layer contacts floating gates through a layer including at least a silicon dioxide layer.

33. The nonvolatile memory device according to claim 32, wherein the layer including the silicon dioxide layer constituting the inter-poly silicon insulator film includes nitrogen.

34. The nonvolatile memory device according to claim 31, wherein the tantalum pentoxide layer contacts control gates through a layer including at least a silicon dioxide layer.

35. A nonvolatile semiconductor memory device comprising:
a memory array area constituted from a memory cell array having a plurality of memory cells arranged in a matrix, each of the memory cells being a first MOS field effect transistor comprising a first well region formed in a semiconductor substrate, a first diffusion layer formed in the first well region, for functioning as a source or a drain, a floating gate formed over the first well region through a tunnel dielectric, and a control gate formed over the first well region and the floating gate through an inter-poly silicon insulator film; and a peripheral circuit area having a plurality of second MOS field effect transistors disposed therein, each of the second MOS field effect transistors comprising a second well region formed in the semiconductor substrate, a second diffusion layer formed in the second well region, for functioning as a source or a drain, and a gate electrode formed over the second well region through a gate insulator film;

wherein the inter-poly silicon insulator film is constituted from a multilayer film including at least a tantalum pentoxide layer, and a film thickness of poly silicon of gate electrodes in the peripheral circuit area is formed to be equal to a film thickness of poly silicon constituting control gates in the memory array area.

36. A nonvolatile semiconductor memory device comprising:

a memory array area constituted from a memory cell array having a plurality of memory cells arranged in a matrix, each of the memory cells being a first MOS field effect transistor comprising a first well region formed in a semiconductor substrate, a first diffusion layer formed in the first well region, for functioning as a source or a drain, a floating gate formed over the first well region through a tunnel dielectric, and a control gate formed over the first well and the floating gate through an inter-poly silicon insulator film; and a peripheral circuit area having a plurality of second MOS field effect transistors disposed therein, each of the second MOS field effect transistors comprising a second well region formed in the semiconductor substrate, a second diffusion layer formed in the second well region, for functioning as a source or a drain, and a gate electrode formed over the second well region through a gate insulator film;

wherein the inter-poly silicon insulator film is constituted from a multilayer film including at least a tantalum pentoxide layer, and at least a part of the second MOS field effect transistors use the multilayer film including the tantalum pentoxide layer as gate insulator films.

37. A nonvolatile semiconductor memory device having an memory array area constituted from a memory cell array having a plurality of memory cells arranged in a matrix, each of the memory cells being a first MOS field effect transistor comprising a first well region formed in a semiconductor substrate, a first diffusion layer formed in the first well region, for functioning as a source or a drain, a floating gate formed over the first well region through a tunnel dielectric, and a control gate formed over the floating gate through an inter-poly silicon insulator film, wherein the inter-poly silicon insulator film is constituted from a multilayer film including three layers comprising a first silicon dioxide layer formed over the floating gate, a layer having nitrogen and silicon as main constituent elements formed over the first silicon dioxide layer, and a tantalum pentoxide layer formed over the layer having nitrogen and silicon as the main constituent elements.

38. The nonvolatile semiconductor memory device according to claim 37, wherein the inter-poly silicon insulator film is constituted from a multilayer film including four layers comprising the first silicon dioxide layer formed over the floating gate, the layer having nitrogen and silicon as the main constituent elements formed over the first silicon dioxide layer, the tantalum pentoxide layer formed over the layer having nitrogen and silicon as the main constituent elements, and a second silicon dioxide layer formed over the tantalum pentoxide layer.

39. The nonvolatile semiconductor memory device according to claim 37, wherein a density of a number of oxygen atoms included in the layer having nitrogen and silicon as the main constituent elements is smaller than a density of a number of nitrogen atoms therein.

40. The nonvolatile semiconductor memory device according to claim 37, wherein the first silicon dioxide film has a thickness of 5 nm or less.

41. The nonvolatile semiconductor memory device according to claim 37, wherein the layer having nitrogen and silicon as the main constituent elements has a thickness of 1.5 nm or more.

42. The nonvolatile semiconductor memory device according to claim 38, wherein the second silicon dioxide film has a thickness of 2 nm or more.

43. The nonvolatile semiconductor memory device according to claim 37, wherein the tantalum pentoxide layer has a dielectric constant of 50 or more.

* * * * *